United States Patent
Agatani et al.

(10) Patent No.: US 8,735,914 B2
(45) Date of Patent: May 27, 2014

(54) LIGHT EMITTING DEVICE HAVING PLURAL LIGHT-EMITTING SECTIONS WITH RESIN WALLS WITHIN RESIN FRAME

(75) Inventors: Makoto Agatani, Osaka (JP); Toshio Hata, Osaka (JP); Tomokazu Nada, Osaka (JP); Toyonori Uemura, Osaka (JP); Shinya Ishizaki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 40 days.

(21) Appl. No.: 13/108,244

(22) Filed: May 16, 2011

(65) Prior Publication Data

US 2011/0278605 A1    Nov. 17, 2011

(30) Foreign Application Priority Data

May 17, 2010  (JP) ................................. 2010-113477
Jul. 21, 2010  (JP) ................................. 2010-164169

(51) Int. Cl.
| | |
|---|---|
| H01L 29/20 | (2006.01) |
| H01L 33/00 | (2010.01) |
| H01L 29/18 | (2006.01) |
| F21V 9/16 | (2006.01) |
| F21S 4/00 | (2006.01) |
| F21V 21/00 | (2006.01) |

(52) U.S. Cl.
USPC .......... 257/89; 257/88; 257/99; 257/E33.061; 362/84; 362/249.01; 362/249.02

(58) Field of Classification Search
None
See application file for complete search history.

(56) References Cited

U.S. PATENT DOCUMENTS

| | | | |
|---|---|---|---|
| 6,686,691 B1 | 2/2004 | Mueller et al. | |
| 7,843,131 B2 | 11/2010 | Konishi et al. | |
| 2003/0067775 A1 | 4/2003 | Nagai et al. | |
| 2008/0224608 A1 | 9/2008 | Konishi et al. | |
| 2008/0231169 A1* | 9/2008 | Hata et al. ...................... | 313/500 |
| 2008/0308311 A1* | 12/2008 | Kodama et al. ................ | 174/260 |
| 2009/0166657 A1 | 7/2009 | Yamada et al. | |
| 2010/0038662 A1* | 2/2010 | Fushimi et al. ................. | 257/98 |
| 2011/0044029 A1 | 2/2011 | Konishi et al. | |
| 2011/0116252 A1* | 5/2011 | Agatani et al. .................. | 362/84 |

FOREIGN PATENT DOCUMENTS

| | | |
|---|---|---|
| CN | 1442836 A | 9/2003 |
| JP | 2002-60747 | 2/2002 |
| JP | 2003-100108 | 4/2003 |

(Continued)

*Primary Examiner* — Michael Jung
(74) *Attorney, Agent, or Firm* — Nixon & Vanderhye P.C.

(57) ABSTRACT

A light emitting device is a light emitting device using light emitting elements and includes: a substrate; a resin frame provided circularly on the substrate; a resin wall provided on the substrate so as to partition an area surrounded by the resin frame into 2 zones; light-emitting sections (a first light-emitting section: blue LEDs+red fluorescent material, a second light-emitting section: blue LEDs+yellow fluorescent material) provided in the respective zones, each of which light-emitting sections includes at least one light emitting element; and first and second anode electrodes and a cathode electrode provided so that each of the light-emitting sections receives current via a corresponding anode electrode and the cathode electrode, the light-emitting sections emitting respective pieces of light each having at least one color, which respective pieces of light have different colors from each other, the first and second anode electrodes being electrically connected to the first and second light-emitting sections, respectively. With the arrangement, which can increase an integration degree, it is possible to achieve a high color rendering property and an excellent color mixing property, to easily adjust a chromaticity, and to easily generate light with a desired chromaticity.

23 Claims, 20 Drawing Sheets

(56) References Cited

FOREIGN PATENT DOCUMENTS

| JP | 2004-356116 | 12/2004 |
| JP | 2006-80334 | 3/2006 |
| JP | 2007-080880 | 3/2007 |
| JP | 2008-227412 | 9/2008 |
| JP | 2009-135485 | 6/2009 |
| JP | 2009-164157 | 7/2009 |
| JP | 2010-205920 | 9/2010 |

* cited by examiner

LIGHT EMITTING DEVICE HAVING PLURAL LIGHT-EMITTING SECTIONS WITH RESIN WALLS WITHIN RESIN FRAME

This Nonprovisional application claims priority under 35 U.S.C. §119(a) on Patent Applications No. 2010-113477 filed in Japan on May 17, 2010, and No. 2010-164169 filed in Japan on Jul. 21, 2010, the entire contents of which are hereby incorporated by reference.

TECHNICAL FIELD

The present invention relates to a light emitting device and an illumination device, each of which employs an LED (Light Emitting Diode). The present invention particularly relates to a technique of generating white light with an excellent color rendering property and an excellent color mixing property.

BACKGROUND ART

In recent years, use of an LED in light sources, such as a general illumination light source and a light source of a backlight for a TV, is been rapidly promoted, as one of environmental countermeasures against global warming. Such light sources employ LED illumination modules configured to emit white light. How to generate white light by use of an LED can be exemplified by, for example, (i) a method in which white light is obtained by a combination of three primary colors of light, which are generated by respective three types of LEDs, namely, a red LED, a blue LED, and a green LED, and (ii) a method in which white light is generated by mixing blue light and yellow light by employing a blue LED as a light source with a yellow fluorescent material. In a field of an LED illumination module, such developments are being made as a development of a high-luminance module and a development of a technique for realizing a light-adjustment function by use of a uniqueness of an LED that a conventional light source does not have.

For example, Patent Literature 1 discloses a technique for generating white light with a light rendering property. According to Patent Literature 1, a composition containing a green fluorescent material and a red fluorescent material, both of which can be excited by a single shared blue LED element, is provided so as to cover the blue LED element, and the blue LED is caused to emit blue light. In the arrangement, (i) the blue light is partially wavelength-converted into green light by the green fluorescent material, and (ii) the blue light is partially wavelength-converted into red light by the red fluorescent material. The green light, the red light, and the blue light are mixed with each other in accordance with additive color mixture, thereby generating white light with a light rendering property.

Further, Patent Literature 2 discloses a technique for generating white light having a desired color tone. According to Patent Literature 2, (i) three types of LED elements, namely, a red LED element which emits red light, a green LED element which emits green light, and a blue LED element which emits blue light, are sealed together in a resin film, and (ii) the three types of LED elements are simultaneously turned on in the resin film while respective amounts of the red light, the green light, and the blue light are adjusted independently, so that they are mixed with each other in accordance with additive color mixture. Thus, white light having a desired color tone is generated.

However, in such a technique as disclosed in Patent Literature 1 that employs different types of fluorescent materials, reabsorption of light occurs between the different fluorescent materials. This makes it difficult to optimize a white light spectrum. Further, in such a technique as disclosed in Patent Literature 2 that causes three types of LED elements to be simultaneously turned on, even if it seems, to the eyes, that white light is obtained, an illuminated object cannot be observed naturally in some cases. This is because, in terms of a spectrum, the white light has a wavelength band having no radiation energy. In view of this, it is difficult to achieve a high color rendering property by the techniques disclosed in Patent Literature 1 and 2.

Meanwhile, Patent Literature 3 discloses a technique for improving the color rendering property by additionally mixing yellow light with red light, green light, and blue light, for example. In a light emitting device disclosed in Patent Literature 3, (i) a red LED element, a green LED element, a blue LED element, and a yellow LED element are provided on a single substrate, and collectively sealed with a translucent resin, and (ii) each of the LED elements is independently driven. This arrangement makes it possible to generate white light that can be adjusted to a given color, while maintaining the color rendering property and color reproducibility.

In the technique disclosed in Patent Literature 3, the color rendering property is improved as compared with the techniques disclosed in Patent Literatures 1 and 2. However, in the technique disclosed in Patent Literature 3, the color rendering property is still low because the blue light, emitted from the blue LED element, is reabsorbed by the red LED element and the green LED element.

On the other hand, in such a method in which white light is generated by mixing blue light and yellow light by use of a blue LED as a light source of a yellow fluorescent material, pseudo white light that is wholly yellowish is generated due to insufficiency of a red-light emission component. For this reason, it is impossible to achieve a high color rendering property by use of the method. However, several methods have been developed to compensate such a red-light emission component that tends to be insufficient.

For example, Patent Literature 4 discloses such a technique that (i) a plurality of white LED devices each of which emits pseudo white light and a plurality of red LED devices each of which emits red light are arranged on a single substrate, (ii) a lens serving as color mixing means is provided above these LED devices, and (iii) the plurality of white LED devices and the plurality of red LED devices are driven independently so as to adjust a tone of white light emitted via the lens.

CITATION LIST

Patent Literature

Patent Literature 1
Japanese Patent Application Publication, Tokukai, No. 2002-60747 A (Publication Date: Feb. 26, 2002)
Patent Literature 2
Japanese Patent Application Publication, Tokukai, No. 2003-100108 A (Publication Date: Apr. 4, 2003)
Patent Literature 3
Japanese Patent Application Publication, Tokukai, No. 2004-356116 A (Publication Date: Dec. 16, 2004)
Patent Literature 4
Japanese Patent Application Publication, Tokukai, No. 2006-80334 A (Publication Date: Mar. 23, 2006)

SUMMARY OF INVENTION

Technical Problem

However, according to the technique disclosed in Patent Literature 4, the plurality of LED devices, each provided as a package component, are arranged on the single substrate in a collective manner. This gives rise to such a problem that an integration degree cannot be increased due to a size of each of the package components. Therefore, an illumination module itself is large in size, and cost of components is high. Further, a spatial color mixing property is low due to the difficulty in increasing the integration degree. This easily causes the plurality of LED devices to appear individual pieces of bright-dot-like light, thereby resulting in unevenness in color.

The present invention is accomplished in view of the problems. An object of the present invention is to provide a light emitting device and an illumination device, each of which is arranged such that an integration degree can be increased, each of which has a high color rendering property and an excellent color mixing property, each of which can easily adjust a chromaticity so that light can be easily generated at a desired chromaticity.

Solution to Problem

In order to achieve the object, a light emitting device according to the present invention is a light emitting device using light emitting elements, and includes a substrate; a resin frame provided annularly on the substrate; a resin wall provided on the substrate so as to partition an area surrounded by the resin frame into n ($2 \leq n$) zones; light-emitting sections provided in the respective zones, each of which light-emitting sections includes at least one light emitting element; and anode electrodes and a cathode electrode provided so that each of the light-emitting sections receives current via a corresponding anode electrode and the cathode electrode, at least two of the light-emitting sections emitting respective pieces of light each having at least one color, which respective pieces of light have different colors from each other, the anode electrodes including k ($2 \leq k \leq n$) anode electrodes provided outside the resin frame on the substrate in such a manner that each of the anode electrodes is electrically connected to at least one of the light-emitting sections such that the anode electrodes are electrically connected to different light-emitting sections.

With the above arrangement, each of the light-emitting sections is turned on when current is supplied from a corresponding anode electrode electrically connected thereto. That is, when a voltage is applied to each of the anode electrodes, is possible to independently drive corresponding one or more light-emitting sections. Thus, the above arrangement allows one or more light-emitting sections to be turned on independently. Further, with the above arrangement, by adjusting respective lighting conditions (light-emission intensities) of the light-emitting sections, it is possible to easily adjust overall light emitted from the light emitting device so as to have a desired chromaticity. Note that the overall light is obtained by mixture of colors of respective pieces of light from the light-emitting sections.

Further, the light-emitting sections are provided in respective areas surrounded by the resin frame and the resin wall. That is, the light-emitting sections can be arranged in a close manner, thereby increasing an integration degree. As a result, colors of respective pieces of light are mixed with each other with a short optical path length, thereby achieving an excellent color mixing property and hardly causing a fringe in an illuminated region. Further, since the light-emitting sections having similar light distribution characteristics are arranged close to each other, when light emitting elements having different emission colors are turned on at the same time, the emission colors are mixed with each other perfectly. Moreover, since the light-emitting sections are arranged close to each other as such, the light-emitting sections are equivalently affected by heat. This allows the brightness and tone of generated white light to be less affected by heat and deterioration with age, and makes it possible to reduce a variation in peak wavelength and a large variation in color rendering property.

Further, since at least two of the light-emitting sections are arranged such that they emit respective pieces of light each having at least one color and the respective pieces of light have different colors from each other, it is possible to generate light by mixing at least two colors. With the arrangement, it is possible to easily adjust a chromaticity of overall light emitted from the light emitting device, thereby easily achieving a high color rendering property depending on a combination of colors of the respective pieces of light emitted from the light-emitting sections.

Consequently, in such an arrangement that can increase the integration degree, it is possible to achieve a high color rendering property and an excellent color mixing property, and to easily adjust a chromaticity so that light can be easily generated at an intended chromaticity.

An illumination device according to the present invention includes the above light emitting device as a light source.

In the arrangement, the illumination device includes, as a light source, a light emitting device which can achieve a high color rendering property and an excellent color mixing property and which can be easily adjusted to have a desired chromaticity so that light can be easily generated at a desired chromaticity. On this account, the illumination device can be produced as a very excellent illumination device. Further, since the light emitting device uses a light emitting element, it is possible to save energy and space, and the illumination device can be used for long periods.

Advantageous Effects of Invention

As described above, a light emitting device of the present invention is a light emitting device using light emitting elements, and includes: a substrate; a resin frame provided annularly on the substrate; a resin wall provided on the substrate so as to partition an area surrounded by the resin frame into n ($2 \leq n$) zones; light-emitting sections provided in the respective zones, each of which light-emitting sections includes at least one light emitting element; and anode electrodes and a cathode electrode provided so that each of the light-emitting sections receives current via a corresponding anode electrode and the cathode electrode, at least two of the light-emitting sections emitting respective pieces of light each having at least one color, which respective pieces of light having different colors from each other, the anode electrodes including k ($2 \leq k \leq n$) anode electrodes provided outside the resin frame on the substrate in such a manner that each of the anode electrodes is electrically connected to at least one of the light-emitting sections such that the anode electrodes are electrically connected to different light-emitting sections.

With the arrangement, it is possible to increase an integration degree, to achieve a high color rendering property and an excellent color mixing property, and to easily adjust a chromaticity so that light can be easily generated at an intended chromaticity.

An illumination device according to the present invention includes the above light emitting device as a light source.

This makes it possible to produce a very excellent illumination device. Further, since the light emitting device uses a light emitting element, it is possible to save energy and space, and further the illumination device can be used for long periods.

DESCRIPTION OF EMBODIMENTS

Embodiment 1

One embodiment of the present invention is described below with reference to drawings.

Figure 1:
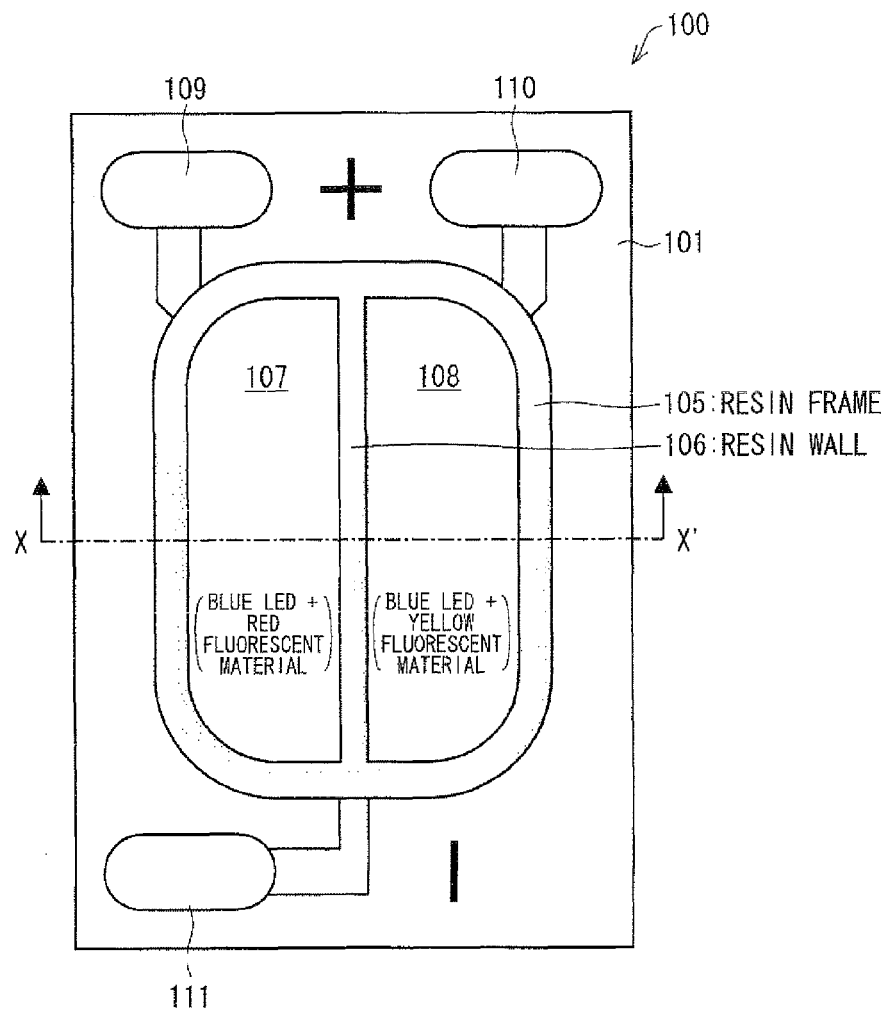
FIG. 1 is a top view illustrating a light emitting device in accordance with Embodiment 1 of the present invention.
Figure 2:
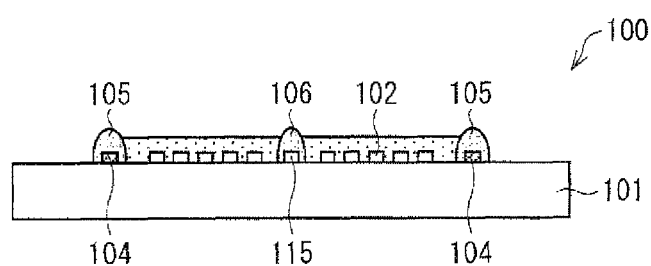
FIG. 2 is a cross-sectional view of the light emitting device taken along a line X-X' in FIG. 1.

The present embodiment deals with a light emitting device that uses LEDs. In the following description, a left-to-right direction in FIG. 1 is referred to as an x direction, while a top-to-bottom direction in FIG. 1 is referred to as a y direction. Further, a top-to-bottom direction in FIG. 2 is referred to as a z direction, and an upper side and a lower side of FIG. 2 are regarded as an upper side and a lower side of the light emitting device, respectively.

(Configuration of Light Emitting Device)

Figure 3:
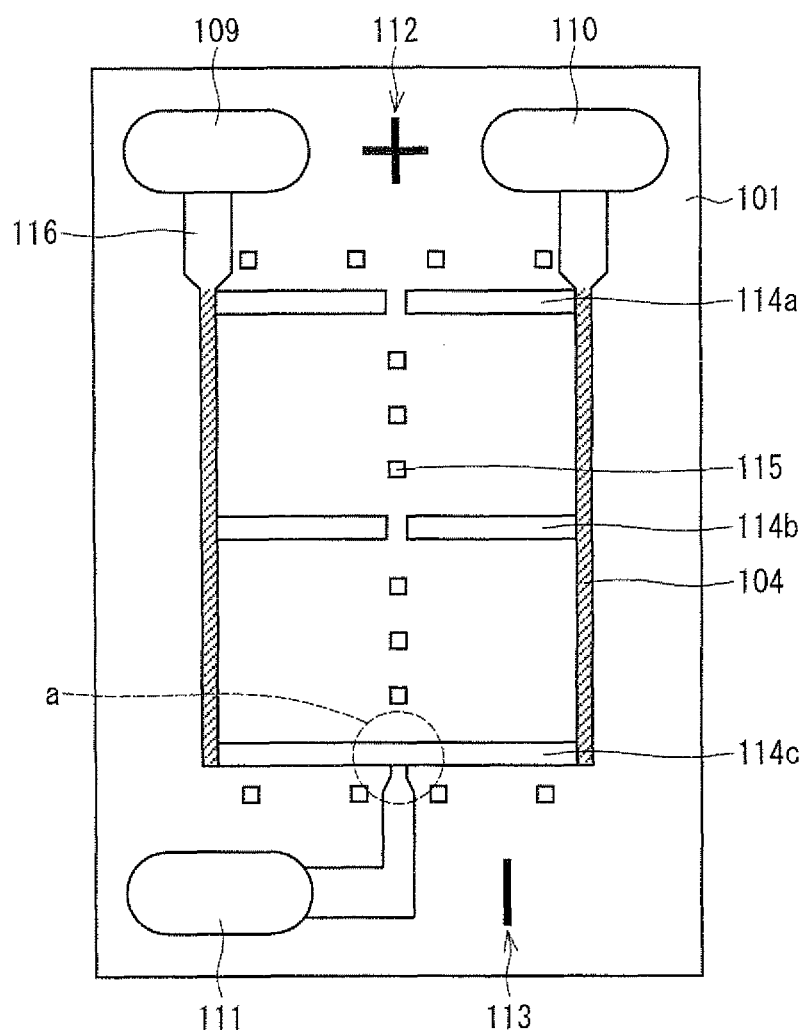
FIG. 3 is a top view illustrating an arrangement of an electrode wiring pattern of the light emitting device of Embodiment 1.
Figure 4:
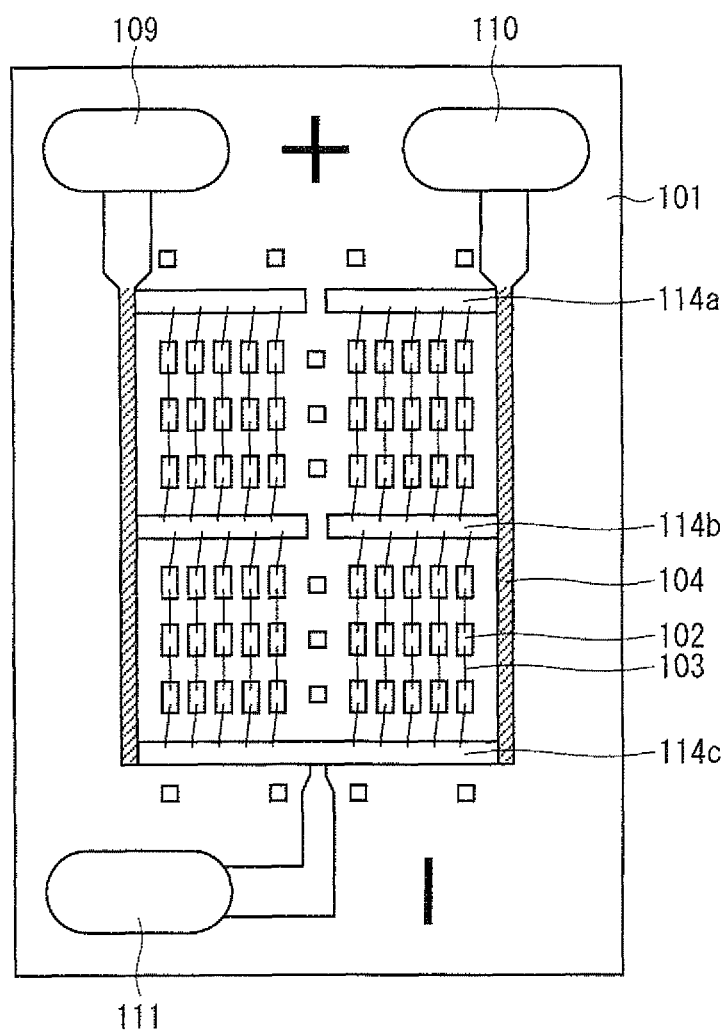
FIG. 4 is a top view illustrating an arrangement of an LED chip of the light emitting device of Embodiment 1.
Figure 5:
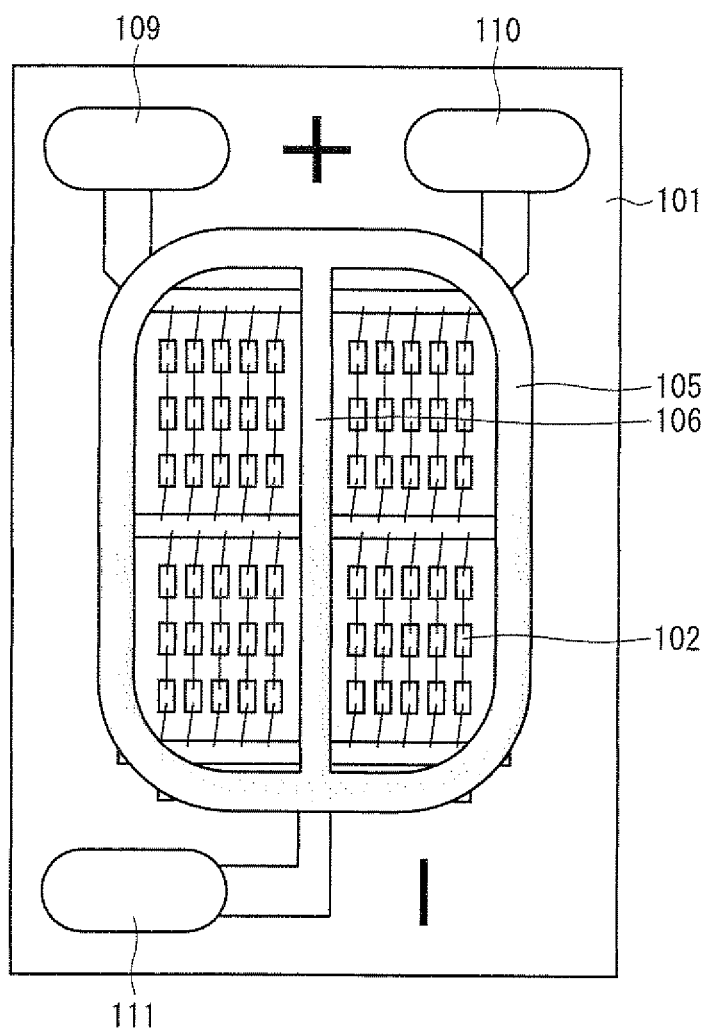
FIG. 5 is a top view illustrating an arrangement of a resin frame and a resin wall of the light emitting device of Embodiment 1.
Figure 6:
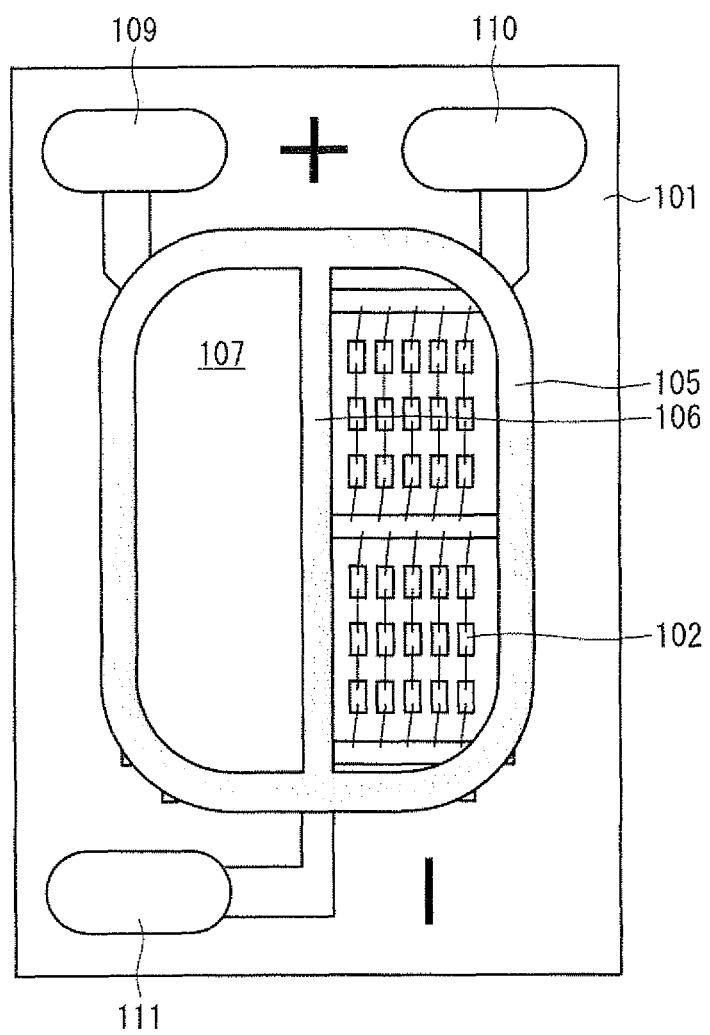
FIG. 6 is a top view illustrating an arrangement of a first fluorescent-material-containing resin layer of the light emitting device of Embodiment 1.

FIG. 1 is a top view illustrating an example of a configuration of a light emitting device 100 of the present embodiment. FIG. 2 is a cross-sectional view of the light emitting device 100 taken along a line X-X' in FIG. 1. FIG. 3 is a top view illustrating how an electrode wiring pattern 114, printed resistors 104, and the like are provided on a substrate 101. FIG. 4 is a top view illustrating how LED chips 102 are provided on the substrate 101. FIG. 5 is a top view illustrating how a resin frame 105 and a resin wall 106 are provided on the substrate 101. FIG. 6 is a top view illustrating how a first fluorescent-material-containing resin layer 107 is provided on the substrate 101.

As illustrated in FIG. 1 through FIG. 6, the light emitting device 100 of the present embodiment includes a substrate 101, LED chips 102 (light emitting elements), printed resistors 104 (protective elements), a resin frame 105, a resin wall 106, a first fluorescent-material-containing resin layer 107 (red-fluorescent-material-containing resin layer), and a second fluorescent-material-containing resin layer 108 (yellow-fluorescent-material-containing resin layer).

The substrate 101 is a ceramic substrate made from ceramics. The substrate 101 has a rectangular outer shape when viewed from above (in a top view). On one surface (hereinafter referred to as "mounting surface") of the substrate 101 are provided the LED chips 102, the printed resistors 104, the resin frame 105, the resin wall 106, the first fluorescent-material-containing resin layer 107, and the second fluorescent-material-containing resin layer 108. Further, on the mounting surface of the substrate 101, as illustrated in FIG. 3, electrodes for external connection, i.e., a first anode electrode 109, a second anode electrode 110, and a cathode electrode 111, and an electrode wiring pattern 114 for wire-bonding are directly provided.

The first anode electrode 109, the second anode electrode 110, and the cathode electrode 111 are electrodes for supplying current to the LED chips 102, and are connectable to an external voltage supply provided outside the light emitting device 100. The first anode electrode 109, the second anode electrode 110, and the cathode electrode 111 are made from silver (Ag)-platinum (Pt), for example. The first anode electrode 109 and the second anode electrode 110 are provided around respective corners (the upper left corner and the upper right corner in FIG. 1) on one side among four sides of the mounting surface of the substrate 101. The cathode electrode 111 is provided around a corner (the left bottom corner in FIG. 1) on another side among the four sides of the mounting surface of the substrate 101 which side is opposite the side on which the first anode electrode and the second anode electrode 110 are provided.

Further, the first anode electrode 109, the second anode electrode 110, and the cathode electrode 111 have an elliptical shape when viewed from above (i.e., an elliptical shape when viewed in a plane manner). In order to produce the light emitting device 100 to have a small size, it is preferable that the first anode electrode 109, the second anode electrode 110, and the cathode electrode 111 be arranged such that their longitudinal directions are parallel to the respective sides on which they are provided.

The electrode wiring pattern 114 serves as (i) an electrode that is electrically connected to the LED chips 102 by wire-bonding and (ii) a wiring line that runs around the LED chips 102 so as to conduct electrical connection. The electrode wiring pattern 114 is made from silver (Ag)/lead (Pd). The electrode wiring pattern 114 is provided partially around a mounting area on which the LED chips 102 are provided, in conformity with a circuit configuration. In the present embodiment, electrode wiring lines 114a to 114c are provided as the electrode wiring pattern 114. The electrode wiring lines 114a to 114c are provided at intervals along the y direction in this order from the upper side in FIG. 3, and extend along the x direction. Each of the electrode wiring lines 114a and 114b is discontinued at its central portion.

Further, as the electrode wiring pattern 114, a wiring line for electrically connecting the first anode electrode 109 to one end of the electrode wiring line 114a, a wiring line for electrically connecting the second anode electrode 110 to the another end of the electrode wiring line 114a, and a wiring line for electrically connecting the cathode electrode 111 to a central portion of the electrode wiring line 114c are provided.

Each of the LED chips 102 is a blue LED (blue light emitting element) having an emission peak wavelength of around 450 nm, but is not limited to this. The LED chip 102 to be used may be, for example, an ultraviolet (near-ultraviolet) LED chip having an emission peak wavelength of 390 nm to 420 nm. With the use of such an ultraviolet (near-ultraviolet) LED chip, it is possible to further improve luminous efficiency. As illustrated in FIG. 4, a plurality of LED chips 102 (in this embodiment, 60 LED chips 102) are provided (by die-bonding) on the mounting surface of the substrate 101 at such positions that allow a predetermined light-emission amount. The LED chips 102 are electrically connected by wire-bonding using wires 103. The wires 103 are made from gold, for example.

Each of the printed resistor 104 is a resistor element formed in such a manner that a printed paste resistor component is sintered to be fixed. Each of the printed resistors 104 is connected in parallel with circuits in each of which a plurality of LED chips 102 are provided in series. Such a circuit configuration makes it possible to protect the LED chips 102 from electrostatic discharge withstand voltage. In the present embodiment, the printed resistors 104 are provided partially on the mounting surface of the substrate 101 in such a manner that the printed resistors 104 are respectively connected in parallel with (a) the LED chips 102 that are covered with the first fluorescent-material-containing resin layer 107 and (b) the LED chips 102 that are covered with the second fluorescent-material-containing resin layer 108. Further, the printed resistors 104 are provided below the resin frame 105.

The resin frame 105 functions as a dam (banking member) for preventing leakage of resins of the first fluorescent-material-containing resin layer 107 and the second fluorescent-material-containing resin layer 108. The resin frame 105 is provided in an annularly-rectangular shape having curved corners in its top view so as to surround all predetermined mounting areas in which the LED chips 102 are to be provided.

The resin wall 106 is a partition wall, which partitions an area surrounded by the resin frame 105 into a plurality of regions (zones). In the present embodiment, the resin wall 106 partitions the area surrounded by the resin frame 105 into (i) a formation area in which the first fluorescent-material-containing resin layer 107 is to be provided and (ii) a formation area in which the second fluorescent-material-containing resin layer 108 is to be provided. The resin wall 106 is singularly and linearly provided along the y direction, and serves as a boundary wall between the first fluorescent-material-containing resin layer 107 and the second fluorescent-material-containing resin layer 108.

The resin frame 105 and the resin wall 106 are formed in an integrated manner, and made from resin having a light reflectivity or a light blocking effect. More specifically, the resin frame 105 and the resin wall 106 are made from, for example, white silicone resin (a material containing translucent silicone resin as a base material and titanium oxide $TiO_2$ as a light diffusion filler) and the like. Since the resin frame 105 and, the resin wall 106 have a light reflectivity or a light blocking effect, it is possible to prevent the resin frame 105 and the resin wall 106 from absorbing light, thereby preventing a decrease in luminous efficiency.

The material of the resin frame 105 and the resin wall 106 is not limited to the above, and may be acryl, urethane, epoxy, polyester, acrylonitrile butanediene styrene (ABS), polycarbonate (PC) resin, or the like. Further, the color of the resin frame 105 and the resin wall 106 is not limited to white, and may be milky white, for example. Coloring the resin in white or milky white makes it possible to decrease an optical transmittance of the resin or allows the resin to have a light reflectivity.

The first fluorescent-material-containing resin layer 107 is a sealing resin layer made from resin containing a first particulate fluorescent material. The first fluorescent-material-containing resin layer 107 is filled in one (the left one in FIG. 1) of the regions surrounded by the resin frame 105 and the resin wall 106, so as to cover the LED chips 102 and the wires 103 provided in that region.

The second fluorescent-material-containing resin layer 108 is a sealing resin layer made from resin containing a second particulate fluorescent material. The second fluorescent-material-containing resin layer 108 is filled in the other one (the right one in FIG. 1) of the regions surrounded by the resin frame 105 and the resin wall 106, so as to cover the LED chips 102 and the wires 103 provided in that region.

The first particulate fluorescent material to be used is a red fluorescent material $(Sr.Ca)AlSiN_3:Eu$, and the second particulate fluorescent material to be used is a yellow fluorescent material $(Y.Gd)_3(Al.Ga)_5O_{12}:Ce$. The region in which the first fluorescent-material-containing resin layer 107 is provided is a light-emitting section (first light-emitting section) that emits blue light and red light by "blue LEDs+red fluorescent material". The region in which the second fluorescent-material-containing resin layer 108 is provided is a light-emitting section (second light-emitting section) that emits blue light and yellow light, that is, pseudo white light by mixture of the blue light and the yellow light by "blue LEDs+ yellow fluorescent material".

(Production Method of Light Emitting Device)

The following describes a production method of the light emitting device 100 having the above arrangement.

Figure 7:
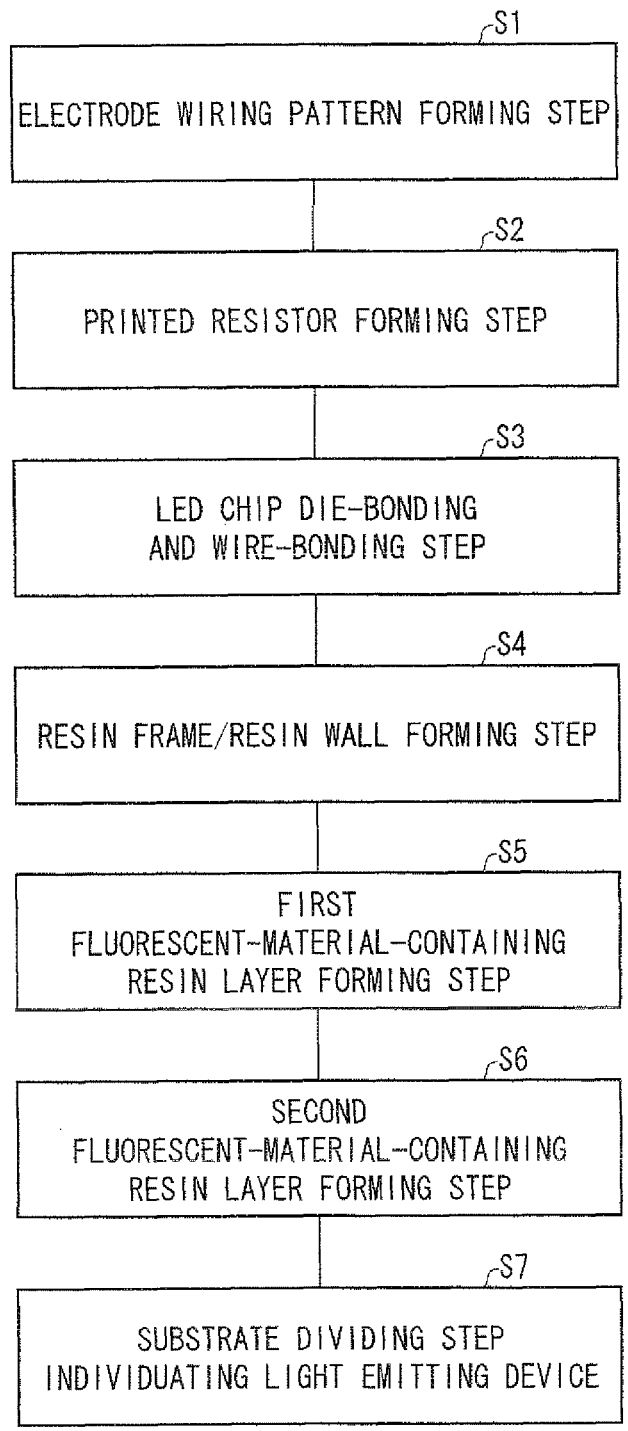
FIG. 7 is a flowchart showing a process flow of how the light emitting device of Embodiment 1 is produced.

FIG. 7 is a flowchart showing a process flow of how the light emitting device 100 is produced. The production process of the light emitting device 100 includes, as shown in FIG. 7, an electrode wiring pattern forming step (Step S1), a printed resistor forming step (Step S2), an LED chip die-bonding and wire-bonding step (Step S3), a resin frame/resin wall forming step (Step S4), a first fluorescent-material-containing resin layer forming step (Step S5), a second fluorescent-material-containing resin layer forming step (Step S6), and a substrate dividing step (Step S7). The following describes details of each of these steps.

Note that the light emitting device 100 is produced in an integrated form of a group of a plurality of light emitting devices. The group of the plurality of light emitting devices is divided into individual light emitting devices by dicing the respective light emitting devices along their sides, in a final step of the production process. Thus, the light emitting device 100 is produced as an individual light emitting device. The following describes and illustrates, however, a given light emitting device for convenience of explanation.

(Step S1: Electrode Wiring Pattern Forming Step)

Initially, on the mounting surface of the substrate 101, the first anode electrode 109, the second anode electrode 110, the cathode electrode 111, and the electrode wiring pattern 114 are formed (see FIG. 3). More specifically, on the mounting surface of the substrate 101, a pattern (300 μm in width, 10 μm in total thickness) is formed from Ag/Pd by printing wiring, so as to form the electrode wiring pattern 114 first. Then, the first anode electrode 109, the second anode electrode 110, and the cathode electrode 111 are formed by printing or the like.

The order of the production may be reversed, and in which order the first anode electrode 109, the second anode electrode 110, the cathode electrode 111, and the electrode wiring pattern 114 are to be formed is not especially limited. However, it is preferable that members made from the same material can be formed at the same time, in view of operation efficiency.

In a case where the substrate 101 has a dimension of 15 mm long (longer side), 12 mm wide (shorter side), and 1 mm thick, the first anode electrode 109, the second anode electrode 110, and the cathode electrode 111 each have a diameter of 1.4 mm, a linear portion of 2 mm, and a thickness of 20 μm, for example. Further, the electrode wiring lines 114a and 114b have a width of 0.3 mm, a length of 3.1 mm (length: 1.4 mm, distance of a discontinued portion at a center portion: 0.3 mm), for example, and the electrode wiring line 114c has a width of 0.3 mm and a length of 3.1 mm, for example.

In a portion (a circled portion a in FIG. 3) at which the resin frame 105 and the resin wall 106, which are formed in a latter step, intersect each other, it is preferable that the electrode wiring pattern 114 be reduced in width, as illustrated in the figure. This makes it possible to restrain resin from spreading over the intersection between the resin frame 105 and the resin wall 106.

Further, it is preferable that an anode electrode mark 112 be provided near the first anode electrode 109 and the second anode electrode 110 on the mounting surface of the substrate 101. The anode electrode mark 112 allows visual recognition that the first anode electrode 109 and the second anode electrode 110 are electrodes for anode. Similarly, it is preferable that a cathode electrode mark 113 be provided near the cathode electrode 111. The cathode electrode mark 113 allows visual recognition that the cathode electrode 111 is an electrode for cathode.

Further, it is preferable to provide LED-chip markers 115, which are positional references for positioning the LED chips 102 on the mounting surface of the substrate 101. The positional references are necessary especially in a case where the LED chips 102 are disposed automatically by a machine. Further, in order to prevent that the LED-chip markers 115 absorb light, it is preferable that the LED-chip makers 115 be possibly made below the resin frame 105 and the resin wall 106.

Further, on the mounting surface of the substrate 101 are provided a wiring line for electrically connecting the first anode electrode 109 to one end of the electrode wiring line 114a, a wiring line for electrically connecting the second anode electrode 110 to the other end of the electrode wiring line 114a, and a wiring line for electrically connecting the cathode electrode 111 to a center portion of the electrode wiring line 114c. In these wiring lines, light-absorption preventing films 116 may be provided on respective surfaces of portions of the wiring lines which portions are placed outside the resin frame 105. The light-absorption preventing films 116 are light-reflective members, which can be formed by applying a white paste, for example. By providing the light-absorption preventing films 116 as such, it is possible to prevent light absorption by resin-unsealed wiring lines in an illumination apparatus that employs the light emitting device 100 as a light source.

(Step S2: Printed Resistor Forming Step)

Subsequently, as illustrated in FIG. 3, the printed resistors 104 are formed on the mounting surface of the substrate 101. More specifically, the printed resistors 104 are formed by a forming process including (1) a printing step and (2) a sintering step. In the printing step, a paste containing a resistor component is screen-printed at predetermined positions so as to cover ends of the electrode wiring lines 114a to 114c (on the Ag/Pd electrodes). The paste is made from ruthenium oxide ($RuO_2$, ruthenium as electrically-conductive powder), a fixing agent, a resin, and a solvent. In the sintering step, the substrate 101 thus subjected to the printing step is sintered in an electric furnace at 850° C. for 3 hours, so that the paste is fixed. Thus, the printed resistors 104 are formed.

In this process, one of the printed resistors 104 is formed so as to extend in the y direction and cross one ends of the electrode wiring lines 114a to 114c so that they are electrically connected to each other, and the other one of the printed resistors 104 is formed so as to extend in the y direction and cross the other ends of the electrode wiring lines 114a to 114c so that they are electrically connected to each other. The printed resistors 104 each have a resistance of 100 MΩ, a width of 0.15 mm, a length of 8 mm, and a thickness of 10 μm to 20 μm, for example.

As the electrically-conductive powder, metal or oxide, which are not softened at a sintering temperature or below, is preferable. Examples of the metal or oxide encompass: ruthenium, tin, antimony, zinc, silver, palladium, platinum, gold, nickel, iron, chrome, copper, molybdenum, and tungsten; compounds thereof; and alloys thereof. They can be used solely or in combination. Especially, ruthenium oxide ($RuO_2$) is preferable because, though it is an oxidative product, (a) it exhibits a resistivity of about $3 \times 10^{-7}$ Ω·m, which is approximate to the resistivity of metal, (b) it is very stable under heat, and (c) it can be formed into fine powders.

It is preferable that the printed resistors 104 be provided below the resin frame 105, but how the printed resistors 104 are arranged is not limited to this. In a case where the printed resistors 104 are not provided below the resin frame 105 or the resin wall 106, it is preferable that white resin (protective film) be applied on the printed resistors 104 so as to restrain the light absorption.

(Step 3: LED-Chip Die-Bonding and Wire-Bonding Step)

Subsequently, as illustrate in FIG. 4, the LED chips 102 are disposed on the mounting surface of the substrate 101. More specifically, 60 LED chips 102 are die-bonded, respectively, at predetermined positions with the use of silicone resin, for example. In this step, as illustrated in FIG. 4, 15 LED chips 102 are provided at regular intervals in a matrix of 3 rows×5 columns in each of 4 mounting areas, namely, (i) left and right zones in a region between the electrode wiring line 114*a* and the electrode wiring line 114*b* and (ii) left and right zones in a region between the electrode wiring line 114*b* and the electrode wiring line 114*c*. Note that the LED chips 102 may be arranged at irregular intervals.

Each of the LED chips 102 has a rectangular chip shape in its top view. For example, the LED chip 102 has a longer side of 550 μm, a shorter side of 280 μm, and a height of 120 μm. On a top surface of the rectangular shape of the LED chip 102, two chip electrodes, i.e., an anode chip electrode and a cathode chip electrode, are provided at opposite positions along a longitudinal direction of the LED chip 102. All the LED chips 102 are aligned such that longitudinal directions on their top surfaces are along the y direction.

Subsequently, wire-bonding is performed with the use of wires 103. For LED chips 102 provided adjacent to the electrode wiring pattern 114, wire-bonding is performed between the electrode wiring pattern 114 and a chip electrode of each of the LED chips 102. For LED chips 102 adjacent to each other but not via the electrode wiring pattern 114, they are directly connected to each other by performing wire-bonding between respective chip electrodes of the LED chips 102.

Thus, five series-circuit sections in each of which six LED chips 102 are connected in series with each other are provided in parallel between the first anode electrode 109 and the cathode electrode 111. Further, five series-circuit sections in each of which six LED chips 102 are connected in series with each other are provided in parallel between the second anode electrode 110 and the cathode electrode 111. In this way, it is possible to supply current to each of the LED chips 102 via corresponding electrodes (the first anode electrode 109, the second anode electrode 110, and the cathode electrode 111) of the substrate 101.

(Step S4: Resin Frame/Resin Wall Forming Step)

After that, the resin frame 105 and the resin wall 106 are formed on the mounting surface of the substrate 101, as illustrated in FIG. 5. More specifically, liquid-type white silicone resin (containing a light diffusion filter $TiO_2$) is drawn at predetermined positions by a dispenser, for example. Then, the white silicone resin is cured at 150° C. (curing temperature) for 60 minutes (curing time). Thus, the resin frame 105 and the resin wall 106 are formed. The curing temperature and the curing time are just examples, and not limited to the aforementioned values.

The resin frame 105 has, for example, a resin width of 0.4 mm, a longer side of 10 mm, and a shorter side of 7.4 mm. The resin wall 106 has, for example, a resin width of 0.4 mm and a linear portion of 10 mm. The shape of the resin frame 105 is not limited to the annularly-rectangular shape having curved corners in the top view, and may be an annularly-circular or a annularly-polygonal shape. Especially, in a case where the resin frame 105 is of an annularly-circular shape (a circular shape when viewed in a plane manner), a light-emission region of the entire light emitting device 100 becomes a round shape at the time when all the LED chips 102 are turned on at the same time. This readily allows light to be emitted uniformly toward all directions. Further, the arrangement allows the light emitting device 100 to be readily used in general-purpose lighting apparatuses and such general-purpose lighting apparatus to be easily designed.

Moreover, the resin frame 105 is disposed above the printed resistor 104. By covering a largest possible area of the printed resistors 104 with the resin frame 105, it is possible to minimize light absorption by the printed resistors. This makes it possible to prevent a decrease in an amount of light output from the light emitting device 100.

It is preferable that the resin frame 105 and the resin wall 106 be formed in an integrated manner. However, the resin frame 105 and the resin wall 106 may be made from different materials and formed separately as long as the first fluorescent-material-containing resin layer 107 and the second fluorescent-material-containing resin layer 108 can be partitioned without any leakage of resins.

Further, in the present embodiment, the forming step of the resin frame 105 and the resin wall 106 is performed after the die-bonding and wire-bonding step of the LED chips 102 (Step S3 is followed by Step S4). However, the order of the steps may be inversed (Step S4 may be followed by Step S3).

(Step S5: First Fluorescent-Material-Containing Resin Layer Forming Step)

Subsequently, as illustrated in FIG. 6, the first fluorescent-material-containing resin layer 107 is formed on the mounting surface of the substrate 101. More specifically, a fluorescent-particle-containing resin in which the first particulate fluorescent material is dispersed in transparent liquid silicone resin is filled into one (the left one in FIG. 6) of regions surrounded by the resin frame 105 and the resin wall 106. After the fluorescent-particle-containing resin is filled, the substrate 101 is maintained at 80° C. for 90 minutes. Then, the fluorescent-particle-containing resin is cured at 120° C. for 60 minutes. Thus, the first fluorescent-material-containing resin layer 107 is formed.

(Step S6: Second Fluorescent-Material-Containing Resin Layer Forming Step)

Subsequently, as illustrated in FIG. 1, the second fluorescent-material-containing resin layer 108 is formed on the mounting surface of the substrate 101. More specifically, a fluorescent-particle-containing resin in which the second particulate fluorescent is dispersed in material transparent liquid silicone resin is filled into the other one (the right one in FIG. 1) of the regions surrounded by the resin frame 105 and the resin wall 106. After the fluorescent-particle-containing resin is filled, the substrate 101 is maintained at 80° C. for 90 minutes. Then, the fluorescent-particle-containing resin is cured at 120° C. for 60 minutes. Thus, the second fluorescent-material-containing resin layer 108 is formed.

(Step S7: Substrate Dividing Step)

Finally, the substrate 101 is divided into individual light emitting devices 100. How to divide the substrate 101 may be such a method that the substrate 101 is placed with the mounting surface being upturned and the substrate 101 is sheared by a cutter from upper sides of partitioning grooves (not shown) provided on a backside of the substrate 101. In the method, the substrate 101 is split along the partitioning grooves, and thus, the substrate 101 can be easily divided. By the dividing step, such an individual light emitting device 100 as illustrated in FIG. 1 can be produced. By producing the light emitting device 100 in this manner, it is possible to improve production yield of the light emitting device 100.

Further, in the light emitting device 100 produced in the above manner, its optical path length to an illuminated object is reduced, thereby achieving good color mixture. The good color mixture indicates such a state that pieces of light emitted from at least two light sources having different emission colors are incident on an object at the same angle. If incident angles of the pieces of light are different, a shadow of the object is split into the different emission colors. Further, in this case, when a light-emission point is directly viewed, separation between the light-emission point and its emission color is observed.

Figure 16:
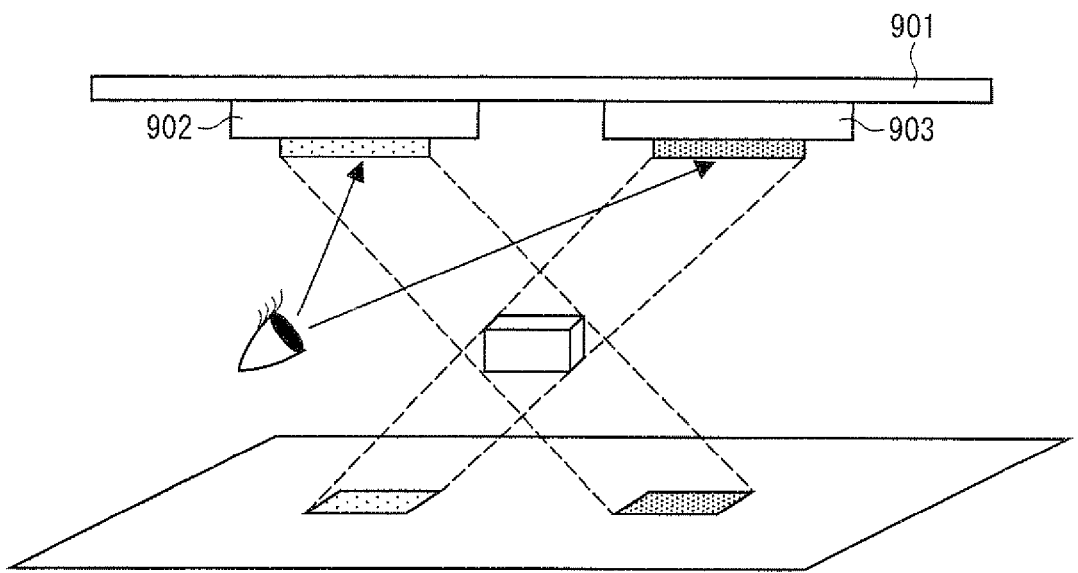
FIG. 16 is a view schematically illustrating how colors of pieces of light are mixed with each other when an LED device which emits light of color A and another LED device which emits a color B are provided on a single substrate in a collective manner.

FIG. 16 is a view illustrating how colors of respective pieces of light are mixed with each other when an LED device 902 which emits light of color A and an LED device 903 which emits light of color B are provided on a single substrate 901 in a collective manner. In this case, when light sources are directly viewed, the light sources appear as two light-emission points having different colors. Further, in this case, due to a low spatial color mixing property, the LED devices easily appear to emit respective pieces of light in a bright-dot-like manner, thereby easily causing unevenness in color (a shadow of an object is split in different colors, or the like). Such a problem also occurs when the LED device 902 and the LED device 903 emit respective pieces of light of the same color.

Figure 17:
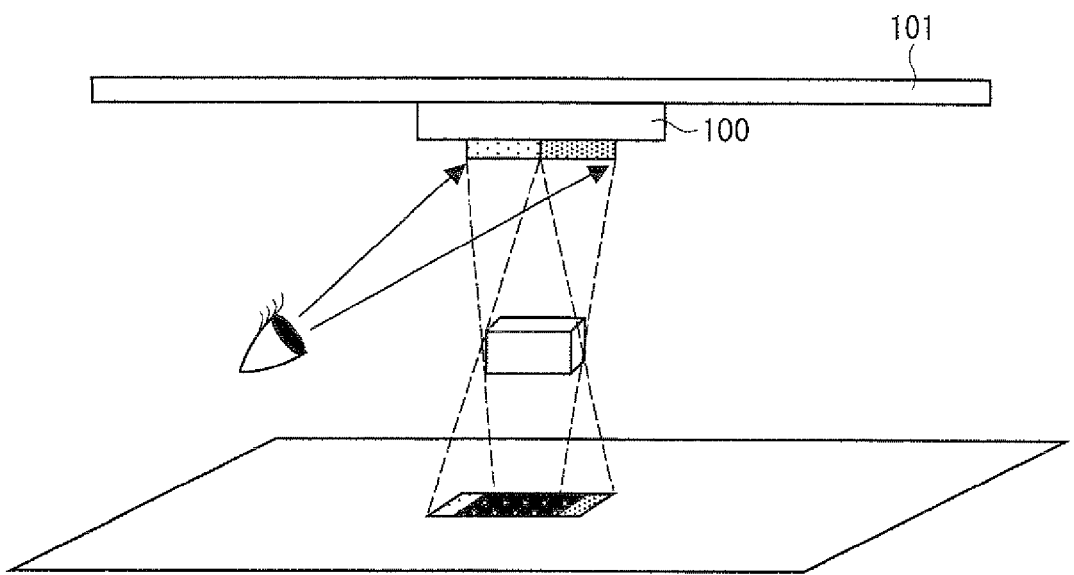
FIG. 17 is a view schematically illustrating how the colors of pieces of light are mixed with each other in the light emitting device illustrated in FIG. 1.

In contrast, in the light emitting device 100 according to the present embodiment, the first fluorescent-material-containing resin layer 107 and the second fluorescent-material-containing resin layer 108 are provided in the respective regions separated by the resin wall 106. That is, two light-emission surfaces having different colors are provided close to each other. Accordingly, as illustrated in FIG. 17, light dispersed into the air from the first fluorescent-material-containing resin layer 107 and light dispersed into the air from the second fluorescent-material-containing resin layer 108 are mixed with each other relatively near the respective light-emission surfaces. Thus, an optical path length from the light emitting device 100 to an illuminated object can be reduced. That is, a distance within which light of approximately mixed colors appears as a single point light source is shortened. Further, since the two light-emission surfaces having different colors are close to each other as such, even when the light sources are directly viewed, the light sources appear as a single light-emission point of light with mixed colors. As a result, separation between the light-emission point and its emission color is hardly observed.

Figure 18:
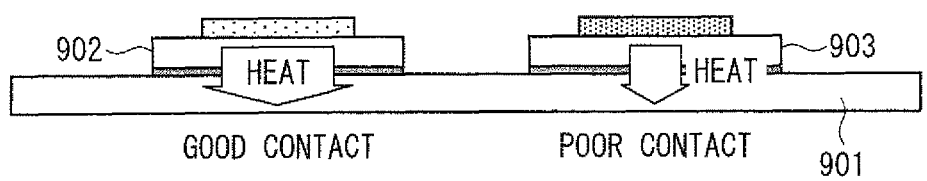
FIG. 18 is a view schematically illustrating a difference in heat discharge property between the LED device which emits the color A and the LED device which emits the color B in a case where they are provided on the single substrate in a collective manner.

Further, there is such a general characteristic of LEDs that luminance decreases and a color changes as a temperature increases. This characteristic causes the following problem. As illustrated in FIG. 18, in the case where the LED device 902 and the LED device 903 are collectively provided on the single substrate 901, the LED devices 902 and 903 may exhibit different heat discharge properties because of unevenness in how they are attached individually. This may cause a difference between the LED devices 902 and 903 in how a temperature increases over time, which further causes a difference in temperature between them. This results in that the LED devices 902 and 903 have different luminance and tone, thereby causing a color mixture balance to be unstable.

Figure 19:
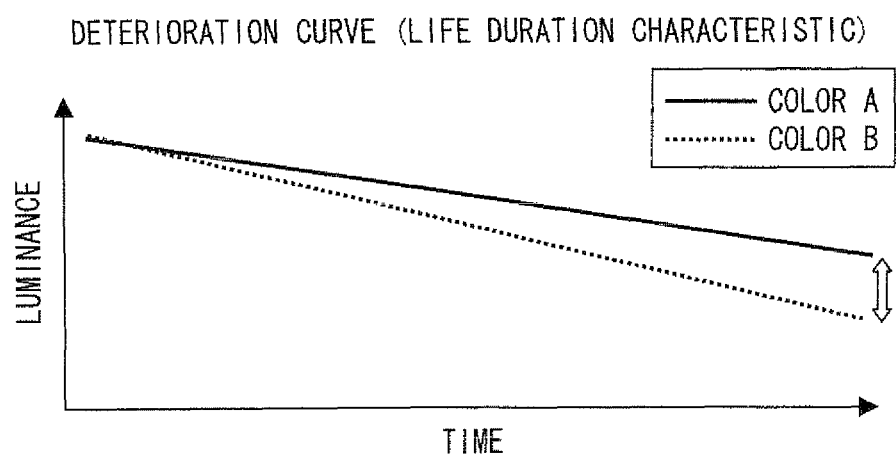
FIG. 19 is a graph showing respective deterioration curves of the colors A and B, which are obtained with the arrangement illustrated in FIG. 18.

Moreover, how long a general LED element and a general LED package can be used is affected by a temperature characteristic during driving. On this account, if there is a difference in temperature characteristic as illustrated in FIG. 18, the LED devices 902 and 903 are deteriorated at different speeds (unevenness in life duration occurs) as shown in FIG. 19. In FIG. 19, a color A shows light emitted from the LED device 902, and a color B shows light emitted from the LED device 903. In a case where at least two colors are mixed with each other, if there is a difference in deterioration with age between respective light-emitting sections, a desirable excellent tone cannot be obtained.

Figure 20:
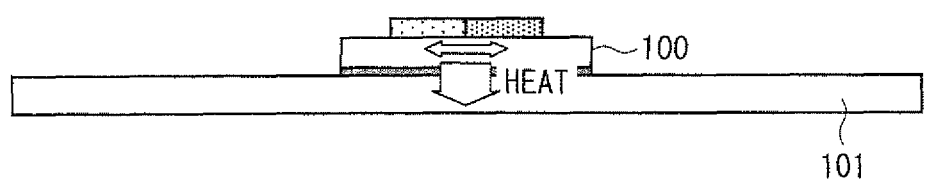
FIG. 20 is a view schematically illustrating a difference in heat discharge property in the light emitting device illustrated in FIG. 1.
Figure 21:
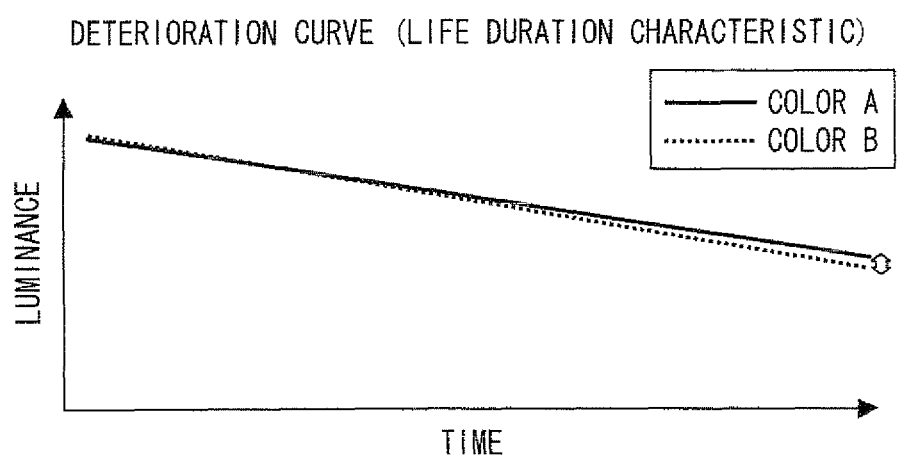
FIG. 21 is a graph showing respective deterioration curves of the colors A and B, which are obtained with the arrangement illustrated in FIG. 20.

In contrast, in the light emitting device 100 according to the present embodiment, as illustrated in FIG. 20, heat sources are provided close to each other on the single substrate 101. This causes temperature changes of the heat sources to be equivalent (or to be hardly different) and makes no difference (or little difference) in attachment state (i.e., heat discharge path) of the heat sources. In this arrangement, characteristic unevenness due to heat from the respective light-emitting sections hardly occurs. Further, as illustrated in FIG. 21, thermal histories of the respective light-emitting sections are equivalent to each other, and a different between their deterioration speeds becomes small (that is, their life durations is stabilized). This hardly causes unevenness in deterioration with age caused due to heat applied to the light-emitting sections. In FIG. 21, a color A shows light emitted from the first fluorescent-material-containing resin layer 107, a color B shows light from the second fluorescent-material-containing resin layer 108. In view of this, the light emitting device 100 can reduce unevenness in luminance and tone, and unevenness in life duration.

As described above, the light emitting device 100 has such an arrangement that (i) a light-emitting section constituted by the LED chips 102 and the first fluorescent-material-containing resin layer 107 and (ii) a light-emitting section constituted by the LED chips 102 and the second fluorescent-material-containing resin layer 108 are respectively formed in two regions surrounded by the resin frame 105 and the resin wall 106. That is, there are formed (i) a first light-emitting section that emits blue light and red light by "blue LEDs+red fluorescent material" and (ii) a second light-emitting section that emits blue light and yellow light, that is, pseudo white light by mixture of the blue light and the yellow light by "blue LEDs+ yellow fluorescent material". Further, the first anode electrode 109 and the second anode electrode 110 are provided outside the resin frame 105 on the mounting surface of the substrate 101. The first anode electrode 109 is electrically connected to the first light-emitting section, and the second anode electrode 110 is electrically connected to the second light-emitting section, so that the anode electrodes are connected to different light-emitting sections.

The respective light-emitting sections are turned on when current is supplied thereto respectively from the first anode electrode 109 and the second anode electrode 110, which are electrically connected to the respective light-emitting sections. That is, when a voltage is applied to each of the first anode electrode 109 and the second anode electrode 110, a corresponding light-emitting section can be driven independently. Accordingly, each of the light-emitting sections can be turned on solely. Further, by adjusting respective lighting conditions (light-emission intensities) of the light-emitting sections, it is possible to easily adjust overall light emitted from the light emitting device 100, which overall light is mixed light of respective pieces of light emitted from the respective light-emitting section, so that the overall light has an intended chromaticity.

That is, it is possible to solely emit pseudo white light obtained by mixing blue light and yellow light, and it is also possible to emit light obtained by mixture of pseudo white light, red light, and blue light. In general, white light generated by mixture of blue light and yellow light lacks a red-light emission component, and therefore becomes pseudo white light that is wholly yellowish. In contrast, in the arrangement of the light emitting device 100, it is possible to adjust by what ratio pseudo white light and red light are mixed with each other. This arrangement makes it possible to easily generate white light in which color deviation is restrained. Further, it is possible to produce mixed light of warm color (like color of a bulb) by increasing an additive ratio of red light.

Further, the light-emitting sections are provided in respective areas surrounded by the resin frame 105 and the resin wall 106. Thus, the light-emitting sections can be arranged in a close manner, thereby increasing an integration degree. As a result, colors of respective pieces of light are mixed with each other with a short optical path length, thereby achieving an excellent color mixing property and hardly causing a fringe in an illuminated region. Further, since the light-emitting sections having similar light distribution characteristics are arranged close to each other, when light emitting elements having different emission colors are turned on at the same time, the emission colors are mixed with each other perfectly. Moreover, since the light-emitting sections are arranged close to each other as such, the light-emitting sections are equivalently affected by heat. This allows the brightness and tone of generated white light to be less affected by heat and deterioration with age, and makes it possible to reduce a variation in peak wavelength and a large variation in color rendering property.

Further, the light-emitting sections are arranged so that they emit respective pieces of light each having at least one color and the respective pieces of light have different colors from each other, thereby making it possible to emit light obtained by mixture of at least two colors. With the arrangement, it is possible to easily adjust a chromaticity of overall light emitted from the light emitting device 100, thereby easily achieving a high color rendering property depending on a combination of colors of the light-emitting sections.

Accordingly, in the light emitting device 100 having an arrangement that can increase the integration degree, it is possible to achieve a high color rendering property and a good color mixing property, and to easily adjust a chromaticity so that light can be easily generated at an intended chromaticity.

Further, with the above arrangement, it is possible to produce such a high-luminance light emitting device 100 with LED chips 102 provided in parallel that (i) use efficiency of blue light emitted from the LED chips 102 is high and (ii) unevenness in luminance and color, color deviation, and crosstalk do not occur. Further, the arrangement can reduce the optical path length, so that a distance in the z direction that is necessary to obtain a well-mixed color can be shortened, thereby making it possible to downsize an illumination apparatus in which the light emitting device 100 is provided.

Further, in the light emitting device 100, one of the printed resistors 104 is connected in parallel with the LED chips 102 that are connected between the first anode electrode 109 and the cathode electrode 111, while the other one of the printed resistors 104 is connected in parallel with the LED chips 102 that are connected between the second anode electrode 110 and the cathode electrode 111. The arrangement can prevent deterioration of the LED chips 102, thereby improving life duration of the LED chips 102 and assuring reliability.

In the above light emitting device 100, each of the light-emitting sections may include at least one LED chip 102. Further, in the light emitting device 100, the number of light-emitting sections is not limited to 2, but may be 3 or more. The number of partitioned areas separated by the resin wall 106 may be changed depending on the number of light-emitting sections. Further, the number of anode electrodes may be at least 2 but not more than the number of light-emitting sections. Each of the anode electrodes is electrically connected to one or more of the light-emitting sections so that the anode electrodes are electrically connected to different light-emitting sections.

Further, the first particulate fluorescent material and the second particulate fluorescent material are not limited to the red fluorescent material and the yellow fluorescent material, respectively. The first particulate fluorescent material and the second particulate fluorescent material may be fluorescent materials different from each other and with which the light emitting device 100 can generate light of a predetermined color (chromaticity) in combination with an emission color of the LED chips 102. Further, in a case where at least two light-emitting sections are provided, the at least two light-emitting sections may be arranged such that they emit respective pieces of light of at least one color and the respective pieces of light have different colors from each other.

In view of this, the light emitting device 100 includes: a substrate 101; a resin frame 105 provided annularly on a mounting surface of the substrate 101; a resin wall 106 provided on the mounting surface of the substrate 101 so as to partition an area surrounded by the resin frame 105 into n (n≤2) pieces of zones; light-emitting sections provided in the respective zones thus partitioned, each of which zones includes at least one LED chip 102; and anode electrodes and a cathode electrode provided so that each of the light-emitting sections receives current from corresponding anode electrode and the cathode electrode, at least two of the light-emitting sections emitting respective pieces of light of at least one color, which respective pieces of light have different colors from each other, the anode electrodes including k (2≤k≤n) pieces of anode electrodes provided outside the resin frame 105 on the mounting surface of the substrate 101, each of the anode electrodes being connected to at least one of the light-emitting sections so that the anode electrodes are electrically connected to different light-emitting sections.

From the practical viewpoint of generating white light in which color deviation is restrained and of generating mixed light with warm color (like color of a bulb), it is desirable that at least one of the light-emitting sections emits at least blue light and yellow light and at least another one of the light-emitting sections, which is different from the at least one of the light-emitting sections, emits at least red light.

Further, in the aforementioned light emitting device 100, the substrate 101 to be used is a substrate made from ceramics. However the substrate 101 is not limited to this. Instead of the ceramic substrate, the substrate 101 may be, for example, a metal-core substrate in which an insulation layer is formed on a surface of a metal substrate. In this case, the metal-core substrate can be arranged such that the insulation layer is formed only in areas in which the printed resistors 104 and the electrode wiring pattern 114 are formed, so that a plurality of LED chips 102 are directly provided on the surface of the metal substrate.

Further, in the present embodiment, a single cathode electrode 111 to be shared by two light-emitting sections is provided on the mounting surface of the substrate 101. However, the cathode electrode may be formed in each of the light-emitting sections (per fluorescent-material-containing resin layer).

Furthermore, in the present embodiment, the printed resistors 104 are provided so as to protect the LED chips 102. However, it is not necessary that the light emitting device 100 include the printed resistors 104. A size of the printed resistors 104 and how the printed resistors 104 are arranged in a circuit are determined depending on the number of LED chips 102 to be provided and in what kind of environment the light emitting device 100 is used (e.g., how large electrostatic discharge withstand voltage is possibly to be applied to the LED chips 102, and the like).

Further, the light emitting device 100 according to the present embodiment includes the LED chips 102 having the same shape. However, the shape of the LED chips 102 is not limited especially limited, and the LED chips 102 to be provided in the light emitting device 100 may have different shapes. For example, as illustrated in FIG. 5, four LED chips 102 provided at four corners of the area surrounded by the resin frame 105 may be changed to LED chips 151 (light emitting elements) having a smaller chip size than that of the LED chips 102 (see FIG. 8).

Figure 8:
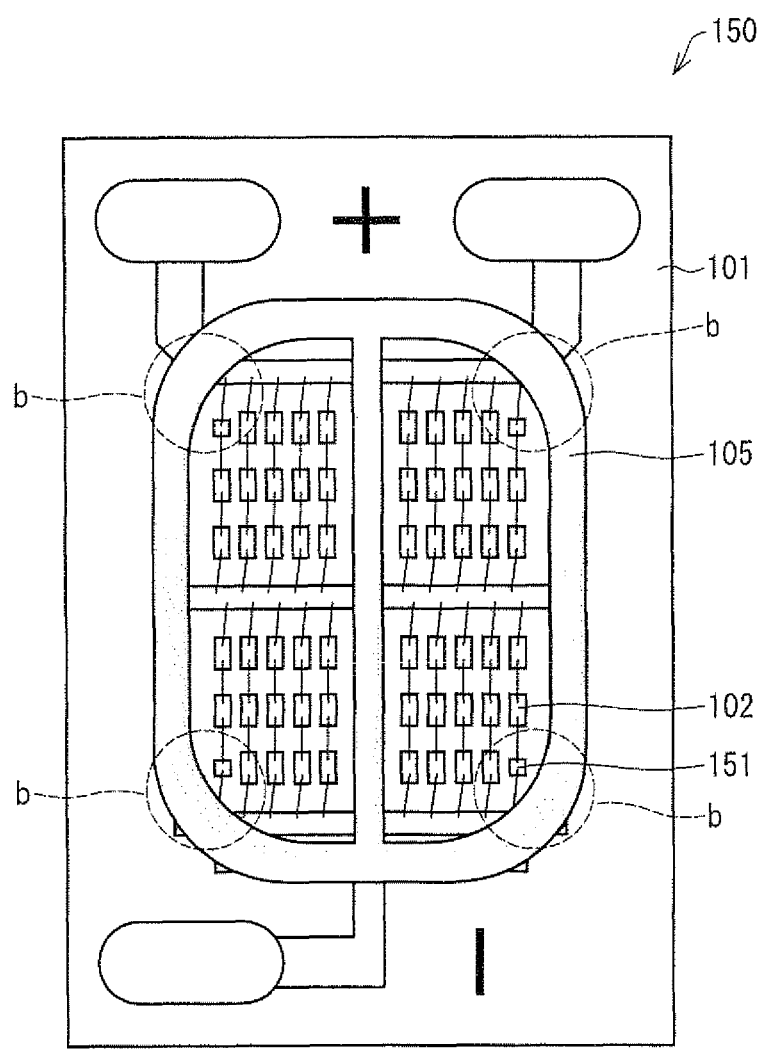
FIG. 8 is a top view illustrating a modified example of the light emitting device of Embodiment 1.

FIG. 8 is a top view illustrating one exemplary arrangement of a light emitting device 150, which is a modified example of the light emitting device 100. In FIG. 8, the first fluorescent-material-containing resin layer 107 and the second fluorescent-material-containing resin layer 108 are not illustrated, in order that shapes and positions of the LED chips 102 and the LED chips 151 are clearly illustrated. The LED chip 151 has a square chip shape in its top view, with a dimension of 280×280 µm and a height of 120 µm, for example.

In the light emitting device 150, square LED chips 151 are respectively provided at four corners (circles portions b in FIG. 8) of an area surrounded by the resin frame 105. In this arrangement, disposition of LED chips at corners can be easily performed. Further, when each LED chip to be used is selectable from the LED chip 102 having a rectangular shape in its top view (rectangular shape when viewed in a plane manner) and the LED chip 151 having a square shape in its top view (square shape when viewed in a plane manner), then it is possible to increase flexibility in how to arrange LED chips and to increase the number of LED chips to be provided.

The following describes other embodiments of the present invention with reference to drawings. Arrangements that are not explained in each of the following embodiments are the same as corresponding arrangements that have been already described above. Further, for convenience of explanation, in each of the following embodiments, a member having the same function as a corresponding member illustrated in the drawings of the aforementioned embodiment has the same reference sign as the corresponding member, and will not explained here.

Embodiment 2

Figure 9:
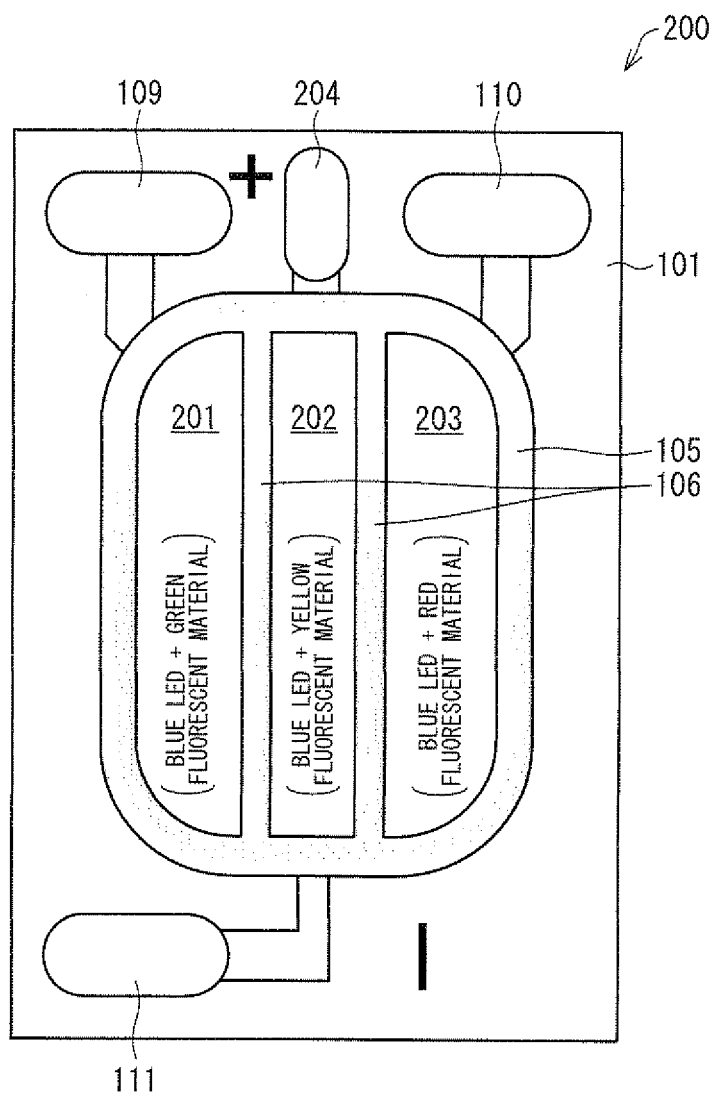
FIG. 9 is a top view illustrating a light emitting device in accordance with Embodiment 2 of the present invention.
Figure 10:
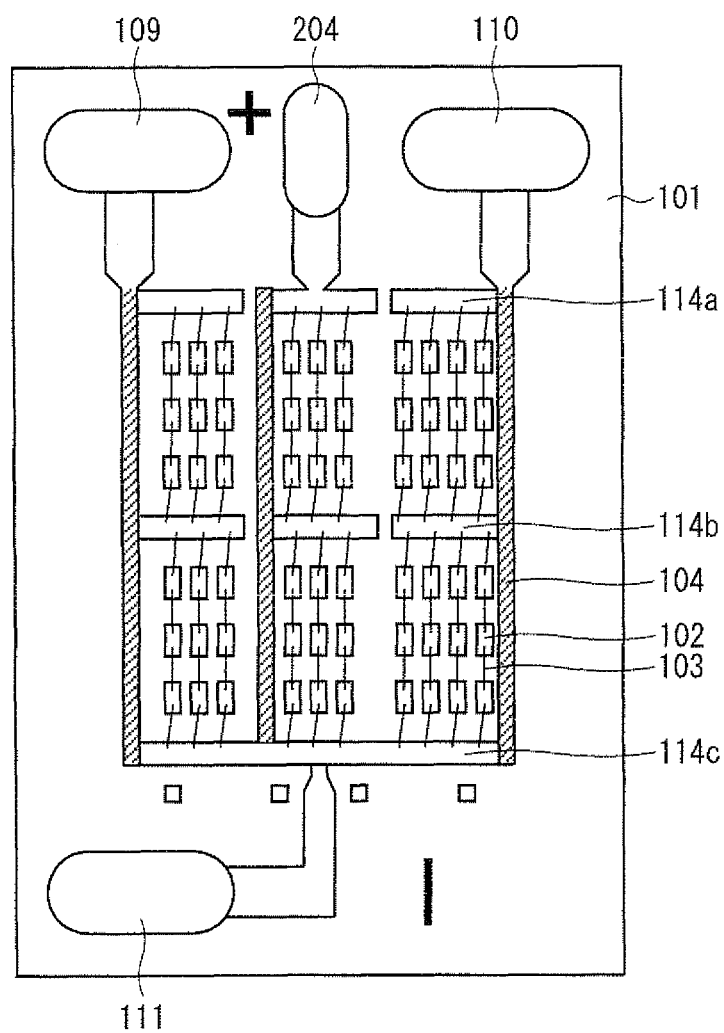
FIG. 10 is a top view illustrating an arrangement of an LED chip of the light emitting device of Embodiment 2.

FIG. 9 is a top view illustrating one exemplary arrangement of a light emitting device 200 in accordance with the present embodiment. FIG. 10 is a top view of the light emitting device 200 in which LED chips 102 are provided.

The light emitting device 200 according to the present embodiment is different from the light emitting device 100 according to Embodiment 1 in that three fluorescent-material-containing resin layers are provided, and they are arranged in a different manner from Embodiment 1. Except for that, the light emitting device 200 has an equivalent arrangement to that of the light emitting device 100 according to Embodiment 1.

As illustrated in FIG. 9 and FIG. 10, the light emitting device 200 according to the present embodiment includes a substrate 101, LED chips 102, printed resistors 104, a resin frame 105, resin walls 106, a third fluorescent-material-containing resin layer 201 (green-fluorescent-material-containing resin layer), a fourth fluorescent-material-containing resin layer 202 (yellow-fluorescent-material-containing resin layer), and a fifth fluorescent-material-containing resin layer 203 (red-fluorescent-material-containing resin layer). On a mounting surface of the substrate 101 are directly provided electrodes for external connection, i.e., a first anode electrode 109, a second anode electrode 110, a third anode electrode 204, and a cathode electrode 111, and an electrode wiring pattern 114 for wire-bonding.

The third anode electrode 204 is an electrode for supplying current to the LED chips 102, and is connectable to an external voltage supply provided outside the light emitting device 200. The third anode electrode 204 is made from, for example, Ag—Pt. The third anode electrode 204 is provided between the first anode electrode 109 and the second anode electrode 110 on one side among four sides of the mounting surface of the substrate 101. That is, the first anode electrode 109, the second anode electrode 110, and the third anode electrode 204 are arranged in line.

Further, the third anode electrode 204 has an elliptical shape when viewed from above (in its top view). The third anode electrode 204 is arranged so that its longitudinal direction intersects longitudinal directions of the first anode electrode 109 and the second anode electrode 110, which are provided so as to sandwich the third anode electrode 204. That is, the third anode electrode 204 is not oriented in the same direction as the first anode electrode 109 and the second anode electrode 110. This makes it possible to easily perform wire connection (soldering) with external wiring lines.

In the present embodiment, each electrode wiring line (114a, 114b) is discontinued at two positions so that it is divided into three portions. Further, as the electrode wiring pattern 114, a wiring line electrically connecting a center portion of the electrode wiring line 114a to the third anode electrode 204 is provided. That is, in this arrangement, among the three portions of the electrode wiring line 114a, the left portion is electrically connected to the first anode electrode 109, the right portion is electrically connected to the second anode electrode 110, and the center portion is electrically connected to the third anode electrode 204.

In the present embodiment, the LED chips 102 are arranged in the following manner. That is, 9 LED chips 102 are provided at regular intervals in a matrix of 3 rows×3 columns in each of 4 mounting areas, namely, (i) left and center areas in a region between the electrode wiring line 114a and the electrode wiring line 114b and (ii) left and center areas in a region between the electrode wiring line 114b and the electrode wiring line 114c. Further, 12 LED chips 102 are provided at regular intervals 3 rows×4 columns in each of 2 mounting areas, namely, (i) a right area in the region between the electrode wiring line 114a and the electrode wiring line 114b and (ii) a right area in the region between the electrode wiring line 114b and the electrode wiring line 114e.

Thus, three series-circuit sections in each of which six LED chips 102 are connected in series with each other are provided in parallel between the first anode electrode 109 and the cathode electrode 111. Further, three series-circuit sections in each of which six LED chips 102 are connected in series with each other are provided in parallel between the third anode electrode 204 and the cathode electrode 111. Further, four series-circuit sections in each of which six LED chips 102 are connected in series with each other are provided in parallel between the second anode electrode 110 and the cathode electrode 111.

In the present embodiment, the printed resistors 104 are provided at three portions. That is, two of the printed resistors 104 are provided at the same portions as in the light emitting device 100 according to Embodiment 1. In addition to that, the other one of the printed resistors 104 is provided so as to extend in the y direction and hang across from one end of the center portion of the electrode wiring line 114a to the electrode wiring line 114c via one end of the center portion of the electrode wiring line 114b. This allows the center portion of the electrode wiring line 114a, the center portion of the electrode wiring line 114b, and the electrode wiring line 114c to be electrically connected to each other.

In the present embodiment, the resin walls 106 partition an area surrounded by the resin frame 105 into respective formation areas of the third fluorescent-material-containing resin layer 201, the fourth fluorescent-material-containing resin layer 202, and the fifth fluorescent-material-containing resin layer 203. That is, two resin walls 106 are provided linearly along the y direction, and serve respectively as (i) a boundary wall between the third fluorescent-material-containing resin layer 201 and the fourth fluorescent-material-containing resin layer 202 and (ii) a boundary wall between the fourth fluorescent-material-containing resin layer 202 and the fifth fluorescent-material-containing resin layer 203.

The third fluorescent-material-containing resin layer 201 is a sealing resin layer made from a resin containing a third particulate fluorescent material. The third fluorescent-material-containing resin layer 201 is filled into any one (the left one in FIG. 9) of three areas each surrounded by the resin frame 105 and at least one of the resin walls 106, so as to cover the LED chips 102 and wires 103 provided in that area.

The fourth fluorescent-material-containing resin layer 202 is a sealing resin layer made from a resin containing a fourth particulate fluorescent material. The fourth fluorescent-material-containing resin layer 202 is filled into any one (the center one in FIG. 9) of the three areas each surrounded by the resin frame 105 and at least one of the resin walls 106, so as to cover the LED chips 102 and wires 103 provided in that area.

The fifth fluorescent-material-containing resin layer 203 is a sealing resin layer made from a resin containing a fifth particulate fluorescent material. The fifth fluorescent-material-containing resin layer 203 is filled into any one (the right one in FIG. 9) of the three areas each surrounded by the resin frame 105 and at least one of the resin walls 106, so as to cover the LED chips 102 and wires 103 provided in that area.

The third particulate fluorescent material to be used is a green fluorescent material $Ca_3(Sc.Mg)_2Si_3O_{12}$:Ce; the fourth particulate fluorescent material to be used is a yellow fluorescent material $(Y.Gd)_3(Al.Ga)_5O_{12}$:Ce; and the fifth particulate fluorescent material to be used is a red fluorescent material $(Sr.Ca)AlSiN_3$:Eu. The third particulate fluorescent material, the fourth particulate fluorescent material, and the fifth particulate fluorescent material may be fluorescent materials with which the light emitting device 200 can emit light having a predetermined color (chromaticity) in combination with emission color of the LED chips 102, and at least two of the particulate fluorescent materials have different colors.

In the arrangement, the area in which the third fluorescent-material-containing resin layer 201 is provided is a light-emitting section (a first light-emitting section) that emits blue light and green light by "blue LEDs+green fluorescent material". Further, the area in which the fourth fluorescent-material-containing resin layer 202 is provided is a light-emitting section (a second light-emitting section) that emits blue light and yellow light, that is, pseudo white light by mixture of the blue light and the yellow light by "blue LEDs+yellow fluorescent material". Furthermore, the area in which the fifth fluorescent-material-containing resin layer 203 is provided is a light-emitting section (a third light-emitting section) that emits blue light and red light by "blue LEDs+red fluorescent material".

As such, the light emitting device 200 has such an arrangement that (i) a light-emitting section constituted by the LED chips 102 and the third fluorescent-material-containing resin layer 201, (ii) a light-emitting section constituted by the LED chip 102 and the fourth fluorescent-material-containing resin layer 202, and (iii) a light-emitting section constituted by the LED chips 102 and the fifth fluorescent-material-containing resin layer 203 are respectively provided in the three areas each surrounded by the resin frame 105 and at least one of the resin walls 106. In other words, the light emitting device 200 is provided with (i) a first light-emitting section that emits blue light and green light by "blue LEDs+green fluorescent material"; (ii) a second light-emitting section that emits blue light and yellow light, that is, pseudo white light by mixture of the blue light and the yellow light by "blue LEDs+yellow fluorescent material"; and (iii) a third light-emitting section that emits blue light and red light by "blue LEDs+red fluorescent material". Furthermore, the light emitting device 200 is provided with the first anode electrode 109 electrically connected to the first light-emitting section; the second anode electrode 110 electrically connected to the third light-emitting section; and the third anode electrode 204 electrically connected to the second light-emitting section.

In the arrangement, the respective light-emitting sections are separately turned on when current is supplied thereto respectively from the first anode electrode 109, the second anode electrode 110, and the third anode electrode 204 thus electrically connected to the respective light-emitting sections. In other words, when a voltage is applied to each of the first anode electrode 109, the second anode electrode 110, and the third anode electrode 204, a corresponding light-emitting section can be driven independently.

Accordingly, the light emitting device 200 can emit only pseudo white light by mixture of blue light and yellow light, and also can emit light of mixed colors of red, green, blue, and yellow. Further, it is possible to adjust by what ratio pseudo white light, red light, and green light are mixed with each other. This makes it possible to increase additive ratios of emission components of red light and green light, thereby easily generating white light having an intended chromaticity within a predetermined range, and further obtaining a widely variable color gamut.

Normally, in a case where different types of fluorescent materials are contained in a resin covering LED chips, or in a case where different types of LED chips are collectively sealed with a resin, light loss occurs due to light reabsorption between the different types of fluorescent materials or the different types of LED elements. This causes such a problem that the luminous efficiency is decreased.

In contrast, in the light emitting device 200, each of the areas each surrounded by the resin frame 105 and at least one of the resin walls 106 is arranged such that one type of LED chips 102 are sealed with a resin containing one type of a fluorescent material. That is, each of the light-emitting sections is constituted by one type of LED chips 102 and one type of a fluorescent material. Since a single resin layer does not contain two or more types of fluorescent materials, it is possible, for example, to prevent that green light (blue-green light) is absorbed (wavelength-converted) by the red fluorescent. Here, the green light (blue-green light) is obtained by wavelength-conversion of blue light emitting from the LED chips 102 due to excitation of the green fluorescent material by the blue light from the LED chips 102. In view of this, it is possible to improve the luminous efficiency of the light emitting device 200.

Embodiment 3

Figure 11:
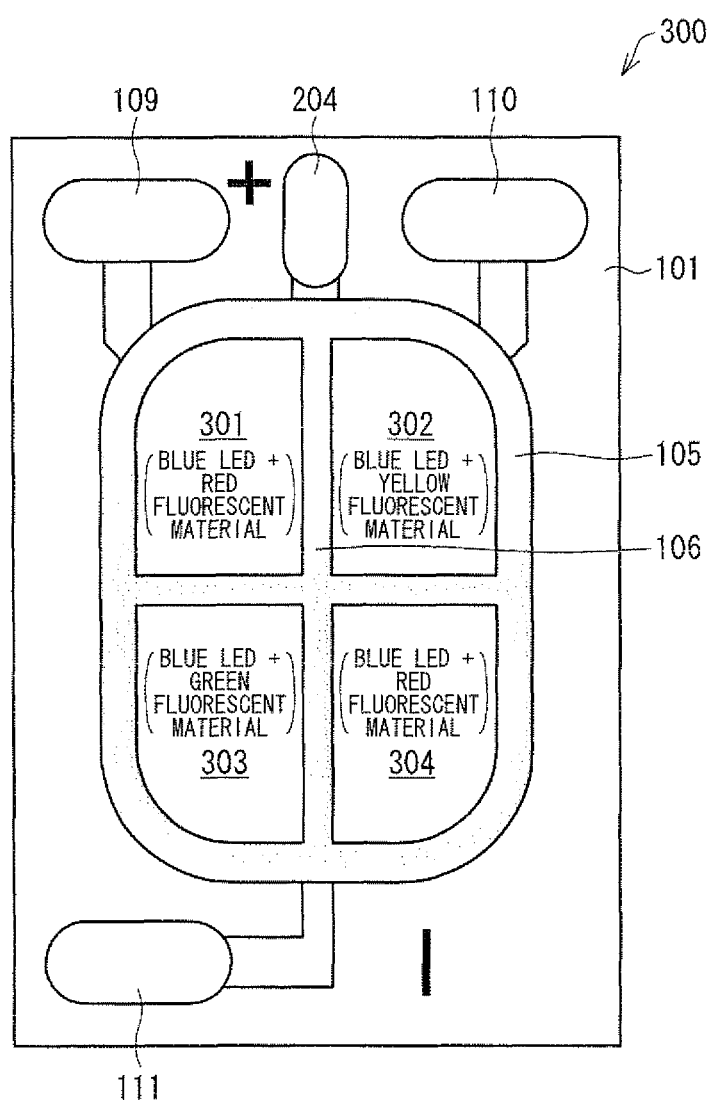
FIG. 11 is a top view illustrating a light emitting device in accordance with Embodiment 3 of the present invention.

FIG. 11 is a top view illustrating one exemplary arrangement of a light emitting device 300 in accordance with the present embodiment.

The light emitting device 300 according to the present embodiment is different from the light emitting device 100 according to Embodiment 1 in that four fluorescent-material-containing resin layers are provided, and they are arranged in a different manner from Embodiment 1. Except for that, the light emitting device 300 according to the present embodiment has an equivalent arrangement to that of the light emitting device 100 according to Embodiment 1.

As illustrated in FIG. 11, the light emitting device 300 according to the present embodiment includes a substrate 101, LED chips 102, printed resistors 104, a resin frame 105, a resin wall 106, a sixth fluorescent-material-containing resin layer 301 (red-fluorescent-material-containing resin layer), a seventh fluorescent-material-containing resin layer 302 (yellow-fluorescent-material-containing resin layer), an eighth fluorescent-material-containing resin layer 303 (green-fluorescent-material-containing resin layer), and a ninth fluorescent-material-containing resin layer 304 (red-fluorescent-material-containing resin layer). On a mounting surface of the substrate 101 are directly provided electrodes for external connection, i.e., a first anode electrode 109, a second anode electrode 110, a third anode electrode 204, and a cathode electrode 111, and an electrode wiring pattern 114 for wire-bonding.

In the light emitting device 300, the resin wall 106 partitions an area surrounded by resin frame 105 into respective formation areas of a sixth fluorescent-material-containing resin layer 301, a seventh fluorescent-material-containing resin layer 302, an eighth fluorescent-material-containing resin layer 303, and a ninth fluorescent-material-containing resin layer 304. The resin wall 106 is cruciately provided (with a cross-shape when viewed in a plane view), and serves as a boundary wall between resin layers.

The sixth fluorescent-material-containing resin layer 301 is a sealing resin layer made from a resin containing a sixth particulate fluorescent material. The sixth fluorescent-material-containing resin layer 301 is filled into any one (the upper left one in FIG. 11) of four areas each surrounded by the resin frame 105 and the resin wall 106, so as to cover LED chips 102 and wires 103 provided in that area.

The seventh fluorescent-material-containing resin layer 302 is a sealing resin layer made from a resin containing a seventh particulate fluorescent material. The seventh fluorescent-material-containing resin layer 302 is filled into any one (the upper right one in FIG. 11) of the four areas surrounded by the resin frame 105 and the resin wall 106, so as to cover LED chips 102 and wires 103 provided in that area.

The eighth fluorescent-material-containing resin layer 303 is a sealing resin layer made from a resin containing an eighth particulate fluorescent material. The eighth fluorescent-material-containing resin layer 303 is filled into one (the lower left one in FIG. 11) of the four areas surrounded by the resin frame 105 and the resin walls 106, so as to cover LED chips 102 and wires 103 provided in that area.

The ninth fluorescent-material-containing resin layer 304 is a sealing resin layer made from a resin containing a ninth particulate fluorescent material. The ninth fluorescent-material-containing resin layer 304 is filled into one (the lower right one in FIG. 11) of the four areas surrounded by the resin frame 105 and the resin wall 106, so as to cover LED chips 102 and wires 103 provided in that area.

The sixth particulate fluorescent material and the ninth particulate fluorescent material to be used are a red fluorescent material $CaAlSiN_3$:Eu; the seventh particulate fluorescent material to be used is a yellow fluorescent material $(Y.Gd)_3(Al.Ga)_5O_{12}$:Ce; and the eighth particulate fluorescent material to be used is a green fluorescent material $Ca_3(Sc.Mg)_2Si_3O_{12}$:Ce. The sixth particulate fluorescent material, the seventh particulate fluorescent material, the eighth particulate fluorescent material, and the ninth particulate fluorescent material may be fluorescent materials with which the light emitting device 300 can emit light having a predetermined color (chromaticity) in combination with an emission color of the LED chips 102 and, at least two of the particulate fluorescent material have different colors.

In the arrangement, the areas in which the sixth fluorescent-material-containing resin layer 301 and the ninth fluorescent-material-containing resin layer 304 are respectively provided are light-emitting sections (a first light-emitting section, a fourth light-emitting section) that emit blue light and red light by "blue LEDs+red fluorescent material". The area in which the seventh fluorescent-material-containing resin layer 302 is provided is a light-emitting section (a second light-emitting section) that emits blue light and yellow light, that is, pseudo white light by mixture of the blue light and the yellow light by "blue LEDs+yellow fluorescent material". The area in which the eighth fluorescent-material-containing resin layer 303 is provided is a light-emitting section (a third light-emitting section) that emits blue light and green light by "blue LEDs+green fluorescent material".

Further, in the light emitting device 300, the LED chips 102 (not shown) are arranged inside each of the resin layers. For example, 15 LED chips 102 are provided in each of the resin layers.

The electrode wiring pattern 114 (not shown) is provided so that each of the first anode electrode 109, the second anode electrode 110, and the third anode electrode 204 can drive any one of the light-emitting section that emits blue light and red light, the light-emitting section that emits pseudo white light, and the light-emitting section that emit blue light and green light. For example, LED chips 102 covered with the eighth fluorescent-material-containing resin layer 303 are electrically connected to each other between the first anode electrode 109 and the cathode electrode 111. Further, between the third anode electrode 204 and the cathode electrode 111, LED chips 102 covered with the sixth fluorescent-material-containing resin layer 301 are electrically connected to LED chips 102 covered with the ninth fluorescent-material-containing resin layer 304. Moreover, LED chips 102 covered with the seventh fluorescent-material-containing resin layer 302 are electrically connected to each other between the second anode electrode 110 and the cathode electrode 111.

As such, the light emitting device 300 has such an arrangement that (a) a light-emitting section constituted by the LED chips 102 and the sixth fluorescent-material-containing resin layer, (b) a light-emitting section constituted by the LED chips 102 and the seventh fluorescent-material-containing resin layer 302, (c) a light-emitting section constituted by the LED chips 102 and the eighth fluorescent-material-containing resin layer 303, and (d) a light-emitting section constituted by the LED chips 102 and the ninth fluorescent-material-containing resin layer 304 are respectively provided in the four areas surrounded by the resin frame 105 and the resin wall 106. In other words, the light emitting device 300 is provided with: (i) a first light-emitting section and a fourth light-emitting section each of which emits blue light and red right by "blue LEDs+red fluorescent material"; (ii) a second light-emitting section that emits blue light and yellow light, that is, pseudo white light by mixture of the blue light and the yellow light by "blue LEDs+yellow fluorescent material"; and (iii) a third light-emitting section that emits blue light and green light by "blue LEDs+green fluorescent material". Further, the light emitting device 300 is provided with the first anode electrode 109 electrically connected to the third light-emitting section; the second anode electrode 110 electrically connected to the second light-emitting section; and the third anode electrode 204 electrically connected to the first light-emitting section and the fourth light-emitting section.

In the arrangement, the respective light-emitting sections are separately turned on when current is supplied thereto respectively from the first anode electrode 109, the second anode electrode 110, and the third anode electrode 204 thus electrically connected to the respective light-emitting sections. In other words, when a voltage is applied to each of the first anode electrode 109, the second anode electrode 110, and the third anode electrode 204, a corresponding light-emitting section(s) can be driven independently. Since the first light-emitting section and the fourth light-emitting section share the third anode electrode, they cannot be turned on separately, but are turned on simultaneously.

Accordingly, the light emitting device 300 can emit white only white light obtained by mixture of red light, green light, and blue light. Further, the light emitting device 300 can emit mixed light of "light of red light+blue light", "pseudo white light (blue light+yellow light), and "light of green light+blue light". Further, in the arrangement, it is possible to adjust by what ratio such pieces of light are mixed with each other. This accordingly makes it possible to increase an additive ratio of an emission component of an insufficient color, thereby easily generating white light in which color deviation is restrained, and further obtaining a widely variable color gamut.

Further, the light emitting device 300 includes not four but three anode electrodes (the first anode electrode 109, the second anode electrode 110, and the third anode electrode 204) are provided. This makes it possible to downsize the light emitting device 300. Further, by adjusting respective lighting conditions (light-emission intensities) of the light-emitting sections from the respective anode electrodes, it is possible to easily generate white light with a high color rendering property or an excellent color reproducibility.

The first light-emitting section and the fourth light-emitting section (the area in which the sixth fluorescent-material-containing resin layer 301 is provided and the area in which the ninth fluorescent-material-containing resin layer 304 is provided) that emit blue light and red light are provided two areas diagonal to each other in the four areas surrounded by the resin frame 105 and the resin wall 106. As such, it is preferable that light-emitting sections (light-emitting sections having the same light emission arrangement) that emit respective pieces of light of the same color be provided not adjacent to each other. The arrangement makes it possible to improve a color mixing property of overall light emitted from the light emitting device, when all of the four light-emitting sections are turned on at the same time.

Embodiment 4

Figure 12:
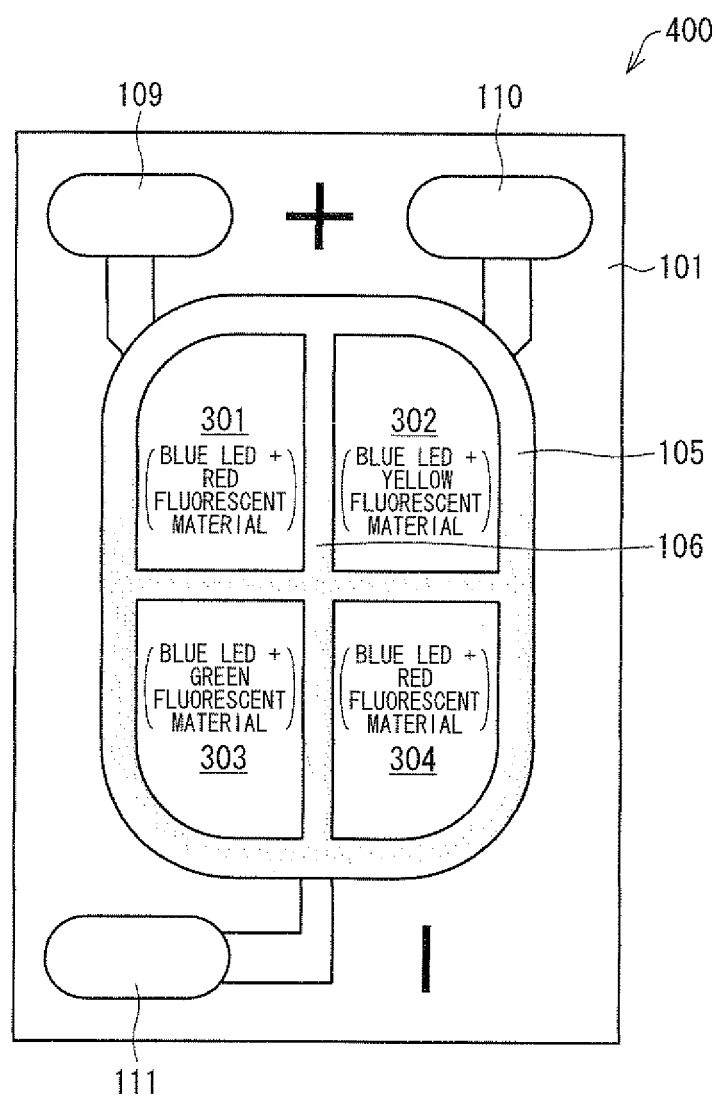
FIG. 12 is a top view illustrating a light emitting device in accordance with Embodiment 4 of the present invention.

FIG. 12 is a top view illustrating one exemplary arrangement of a light emitting device 400 in accordance with the present embodiment.

The light emitting device 400 according to the present embodiment is different from the light emitting device 300 according to Embodiment 3 in the number of anode electrodes and by which anode electrode each of the light-emitting sections are driven. Further, the light emitting device 400 according to Embodiment 4 is different from the light emitting device 300 according to Embodiment 3 in that a red fluorescent material (Sr.Ca)AlSiN$_3$:Eu is used as the sixth particulate fluorescent material and the ninth particulate fluorescent material. Except for that, the light emitting device 400 according to the present embodiment has an equivalent arrangement to that of the light emitting device 300 according to Embodiment 3.

Note that by using the red fluorescent material (Sr.Ca) AlSiN$_3$:Eu instead of the red fluorescent material CaAlSiN$_3$: Eu, red light with a short red emission wavelength is emitted. In this case, the light emitting device emits white light with a decreased color rendering property, but the light emitting device can be improved in emission luminance in consideration of visibility. That is, the light emitting device 400 according to the present embodiment is a light emitting device that aims at achieving a high luminance rather than the color rendering property, as compared with the light emitting device 300 according to Embodiment 3.

As illustrated in FIG. 12, in the light emitting device 400, an electrode wiring pattern 114 (not shown) is provided such that a first anode electrode 109 can drive both (i) a light-emitting section (an area in which a sixth fluorescent-material-containing resin layer 301 is provided) that emits blue light and red light, and (ii) a light emitting section (an area in which an eighth fluorescent-material-containing resin layer 303 is provided) that emits blue light and green light. Further, the electrode wiring pattern 114 is provided so that a second anode electrode 110 can drive both (i) a light-emitting section (an area in which a seventh fluorescent-material-containing resin layer 302 is provided) that emits pseudo white light, and (ii) a light-emitting section (an area in which a ninth fluorescent-material-containing resin layer 304 is provided) that emits blue light and red light.

That is, a layout of the electrode wiring pattern 114 and LED chips 102, connection between the LED chips 102 and the electrode wiring pattern 114 via wires, and connection between the LED chips 102 via wires are arranged in the same manner as in the light emitting device 100 (FIG. 1) according to Embodiment 1. Further, the light emitting device 400 is arranged such that areas corresponding to the first fluorescent-material-containing resin layer 107 and the second fluorescent-material-containing resin layer 108 in the light emitting device 100 according to Embodiment 1 are each partitioned into two areas by a resin wall 106 provided along an electrode wiring line 114b. Further, in a lower one of the two areas in the area corresponding to the first fluorescent-material-containing resin layer 107 in the top view of FIG. 1, a resin layer that contains a green fluorescent material instead of the first particulate fluorescent material is provided. Meanwhile, in a lower one of the two areas in the area corresponding to the second fluorescent-material-containing resin layer 108 in the top view of FIG. 1, a resin layer that contains a red fluorescent material instead of the second particulate fluorescent material is provided.

In the arrangement, a first light-emitting section and a third light-emitting section are turned on when current is supplied thereto from the first anode electrode 109. In the meantime, a second light-emitting section and a fourth light-emitting section are turned on when current is supplied thereto from the second anode electrode 110. By applying respective voltages to the first anode electrode 109 and the second anode electrode 110, it is possible to independently drive (a) a set of the first light-emitting section and the third light-emitting section and (b) a set of the second light-emitting section and the fourth light-emitting section. Since the first light-emitting section and the third light-emitting section share the first anode electrode 109, they cannot be turned on separately, but are turned on simultaneously. In the meantime, since the second light-emitting section and the fourth light-emitting section share the second anode electrode 110, they cannot be turned on separately, but are turned on simultaneously.

Accordingly, the light emitting device 400 can emit only white light obtained by mixture of red light, green light, and blue light. Further, the light emitting device 400 can emit mixed light of "white light (red light+green light+blue light)" and "bulb-like light (pseudo white light (yellow light+blue light)+red light+blue light)". Further, in the arrangement, it is possible to adjust by what ratio the respective pieces of light are mixed. This makes it possible to increase an additive ratio of an emission component of an insufficient color, thereby easily generating white light in which color deviation is restrained, and further obtaining a widely variable color gamut.

Further, the light emitting device 400 has two anode electrodes (the first anode electrode 109 and the second anode electrode 110). This contributes to further downsizing of the light emitting device 400. Moreover, by adjusting respective lighting conditions (light-emission intensities) of the light-emitting sections from the respective anode electrodes, it is possible to easily generate white light with a high color rendering property or an excellent color reproducibility.

Embodiment 5

Figure 13:
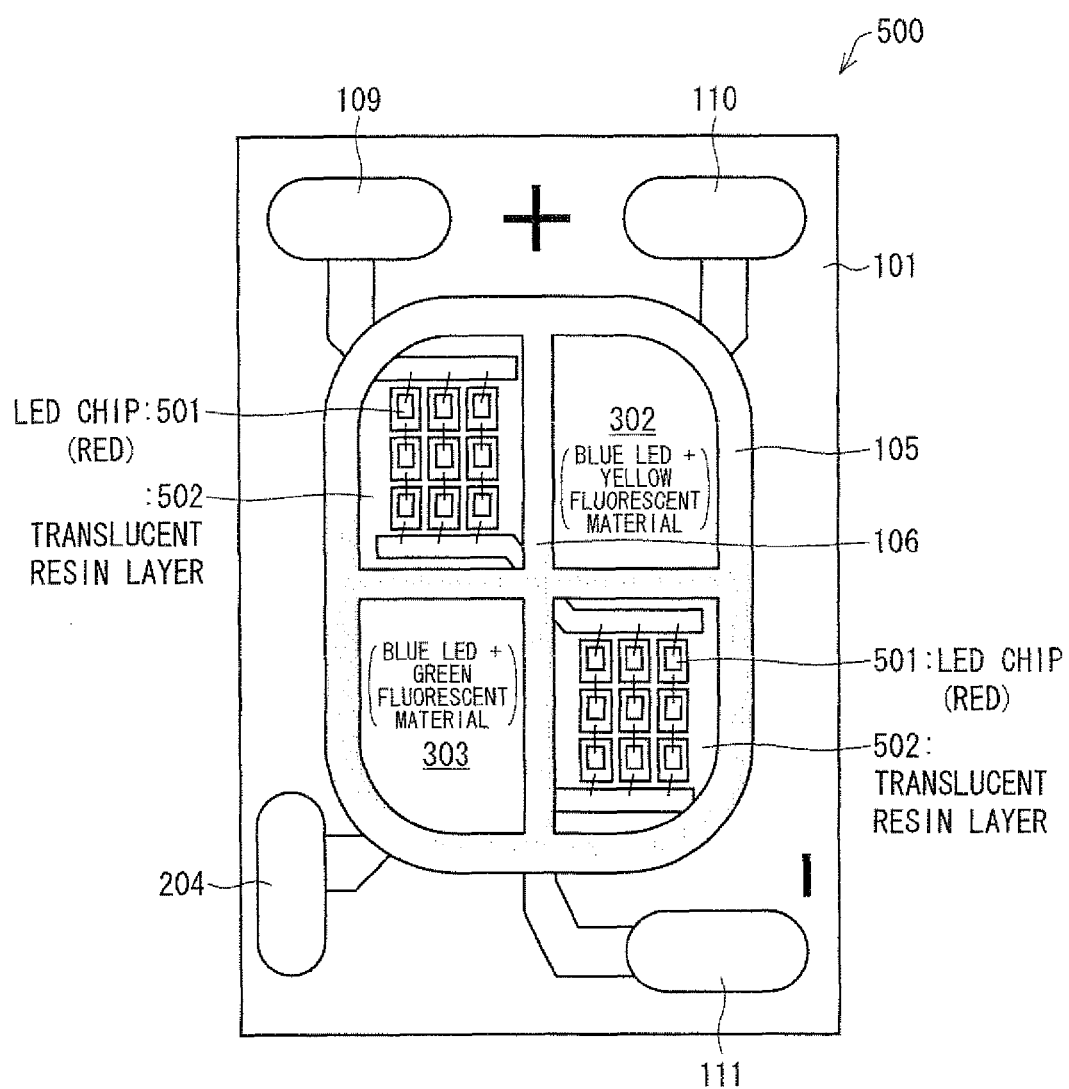
FIG. 13 is a top view illustrating a light emitting device in accordance with Embodiment 5 of the present invention.

FIG. 13 is a top view illustrating one exemplary arrangement of a light emitting device 500 in accordance with the present embodiment.

The light emitting device 500 according to the present embodiment is different from the light emitting device 100 according to Embodiment 1 in that four fluorescent-material-containing resin layers are provided. Further, in conformity with that, the light emitting device 500 is different from the light emitting device 100 in an emission arrangement of how red light is emitted, an arrangement of where anode electrodes are provided, and an arrangement of how an electrode wiring pattern is arranged. Except for that, the light emitting device 500 according to the present embodiment has an equivalent arrangement to the light emitting device 100 according to Embodiment 1.

As illustrated in FIG. 13, in the light emitting device 500, a resin wall 106 partitions an area surrounded by a resin frame 105 into (a) formation areas (two areas) of translucent resin layers 502, (b) a formation area of a seventh fluorescent-material-containing resin layer 302, and (c) a formation area of an eighth fluorescent-material-containing resin layer 303. The resin wall 106 is provided so as to have a crisscross shape, and serves as a boundary wall between resin layers.

Each of the translucent resin layers 502 is a sealing resin layer made from a translucent resin containing no fluorescent material. The translucent resin layers 502 are respectively filled into two areas (the upper left one and the lower right one in FIG. 13), which are diagonal to each other, among four areas surrounded by the resin frame 105 and the resin wall 106, so as to cover LED chips 501 (light emitting elements) and wires 103 provided in the respective areas. The LED chips 501 are red LEDs (red light emitting elements) having an emission peak wavelength of about 650 nm. Note that an LED chip 501 is a chip of a both-side-electrode type in which electrodes are provided on an upper surface and a back surface of a chip.

In the light emitting device 500, a plurality of LED chips 501 (nine LED chips 501 in the present embodiment), which emit red light, are provided in each of the two translucent resin layers 502. In each of the seventh fluorescent-material-containing resin layer 302 and the eighth fluorescent-material-containing resin layer 303, a plurality of LED chips 102 (15 LED chips 102 in the present embodiment) (not shown), which emit blue light, are provided.

In the arrangement, the areas in which the translucent resin layers 502 are provided are light-emitting sections (a first light-emitting section, a fourth light-emitting section) that emit red light by the red LEDs. Unlike the aforementioned embodiments, these light-emitting sections are not arranged to emit light in combination with blue LEDs and a red fluorescent material. Therefore, emission light (blue light) of the blue LEDs is not mixed in the light emitted from these light-emitting sections. With the arrangement, an intensity of blue light is not changed due to red light, and therefore it is possible to easily adjust only a light emission component of red light.

The area in which the seventh fluorescent-material-containing resin layer 302 is provided is a light-emitting section (a second light-emitting section) that emits blue light and yellow light, that is, pseudo white light by mixture of the blue light and the yellow light by "blue LEDs+yellow fluorescent material". The area in which the eighth fluorescent-material-containing resin layer 303 is provided is a light-emitting section (a third light-emitting section) that emits blue light and green light by "blue LEDs+green fluorescent material".

Further, in the light emitting device 500, on a mounting surface of a substrate 101 are directly provided electrodes for external connection, i.e., a first anode electrode 109, a second anode electrode 110, a third anode electrode 204, and a cathode electrode 111, and an electrode wiring pattern 114 (not shown) for wire-bonding. The third anode electrode 204 is provided around a corner (the lower left one in FIG. 13) closest to the eighth fluorescent-material-containing resin layer 303 among four corners of the mounting surface of the substrate 101. Further, the cathode electrode 111 is provided around a corner (the lower right one in FIG. 13) opposite to the corner around which the third anode electrode 204 is provided, the corner (the lower right one in FIG. 13) being one on a side opposite to a side where the first anode electrode 109 and the second anode electrode 110 are provided, among four sides of the mounting surface of the substrate 101.

The electrode wiring pattern 114 is provided so that the first anode electrode 109 can drive the light-emitting sections (the areas in which the translucent resin layers 502 are provided) that emit red light. Further, the electrode wiring pattern 114 is provided so that the second anode electrode 110 can drive the light-emitting section (the area in which the seventh fluorescent-material-containing resin layer 302 is provided) that emits pseudo white light (not shown). Furthermore, the electrode wiring pattern 114 is provided so that the third anode electrode 204 can drive the light-emitting section (the region in which the eighth fluorescent-material-containing resin layer 303 is provided) that emits blue light and green light.

In the arrangement, the LED chips 501 covered with the translucent resin layers 502 are electrically connected to each other between the first anode electrode 109 and the cathode electrode 111. Further, the LED chips 102 covered with the seventh fluorescent-material-containing resin layer 302 are electrically connected to each other between the second anode electrode 110 and the cathode electrode 111. The LED chips 102 covered with the eighth fluorescent-material-containing resin layer 303 are electrically connected to each other between the third anode electrode 204 and the cathode electrode 111.

Herewith, the first light-emitting section and the fourth light-emitting section are turned on when current is supplied thereto from the first anode electrode 109; the second light-emitting section is turned on when current is supplied thereto from the second anode electrode 110; and the third light-emitting section is turned on when current is supplied thereto from the third anode electrode 204. By applying respective voltages to the first anode electrode 109, the second anode electrode 110, and the third anode electrode 204, it is possible to independently drive (i) a set of the first light-emitting section and the fourth light-emitting section, (ii) the second, light-emitting section, and (iii) the third light-emitting section. Since the first light-emitting section and the fourth light-emitting section share the first anode electrode 109, they cannot be turned on separately, but are turned on simultaneously.

Accordingly, the light emitting device 500 can emit only pseudo white light obtained by mixture of blue light and yellow light. Further, the light emitting device 500 can emit only white light obtained by mixture of red light, green light, and blue light. Furthermore, the light emitting device 500 can emit mixed light of "red light", "pseudo white light (blue light+yellow light)", and "blue light+green light". Further, in the arrangement, it is possible to adjust by what ratio the respective pieces of light are mixed with each other. This makes it possible to increase an additive ratio of an emission component of an insufficient color, thereby easily generating white light in which color deviation is restrained, and further obtaining a widely variable color gamut.

Embodiment 6

The present embodiment deals with an electric device including, as a light source, the light emitting device 100 that has been explained in Embodiment 1. For convenience of explanation, the following exemplifies only a case where the light emitting device 100 is employed, but any one of the light emitting devices that have been explained in Embodiments 1 to 5 may be employed. In either case, it is possible to obtain almost the same effect as or a better effect than the effect obtained in the case of the light emitting device 100.

An example of the electronic device may be an illumination device in which the light emitting device 100 is provided on a mounting substrate including a voltage supply circuit on its backside and a heat discharge plate integrally provided thereon. The first anode electrode 109, the second anode electrode 110, and the cathode electrode 111 of the light emitting device 100 are electrically connected, respectively, to a first anode electrode, a second anode electrode, and a cathode electrode on the mounting substrate via external wiring lines or the like. A top surface of the light emitting device 100 is covered with a case having a light-diffusing function or a transparent case.

The number of light emitting devices 100 to be provided is not limited to one. For example, a plurality of light emitting devices 100 may be provided in the illumination device so that one sides of respective rectangular substrates 101 are aligned in parallel, or diagonal directions of the respective rectangular substrates 101 are aligned in line. In this case, the illumination device serves as a fluorescent-light-type illumination device. Alternatively, only one light emitting device 100 may be provided so as to form a bulb-type illumination device.

Figure 14:
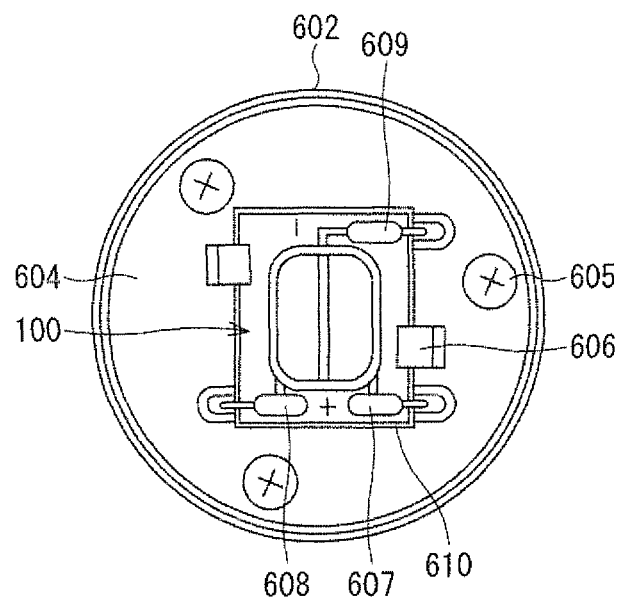
FIG. 14(a) is a view illustrating one embodiment of an LED electric bulb including a light emitting device of the present invention, the view showing how the light emitting device is provided on a surface.
FIG. 14(b) is a side view illustrating an appearance of the LED electric bulb.
Figure 14:
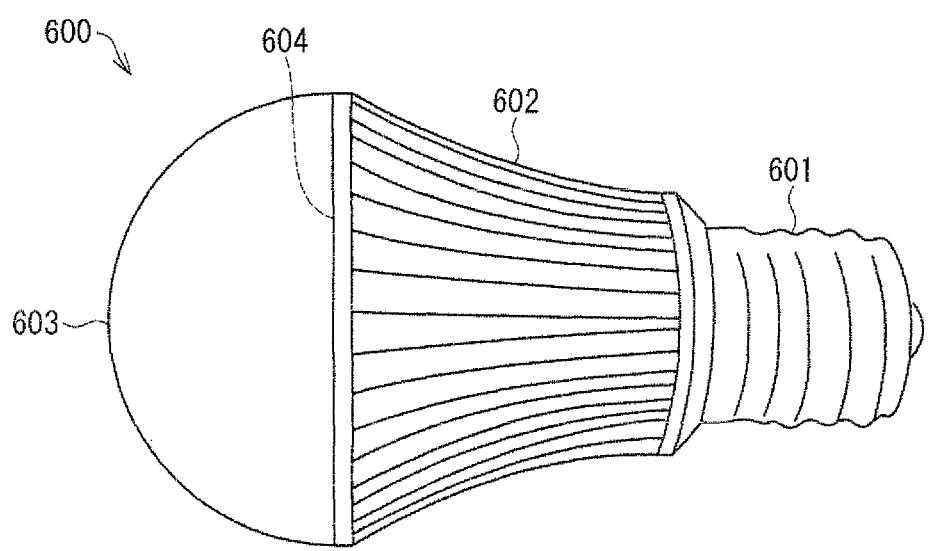

As one concrete example of the illumination device, the following describes an LED electric bulb including the light emitting device 100 that has been explained in Embodiment 1. FIG. 14(*a*) and FIG. 14(*b*) each illustrate one exemplary arrangement of an LED electric bulb 600. FIG. 14(*a*) is a mounting surface on which the light emitting device 100 is provided. FIG. 14(*b*) illustrates a side view of an appearance of the light emitting device 100.

As illustrated in FIG. 14(*a*) and FIG. 14(*b*), the LED electric bulb 600 (illumination device) is configured such that a base plate 604 is fixed, by screws 605, to a radiation fin 602 fastened onto a mouth ring 601, and a lens dome 603 containing a scattering material is provided so as to cover the base plate 604. The mouth ring 601 is a metal part of the electric bulb which metal part is screwed into a socket. A size of the mouth ring 601 may be preferably E26, E17, or the like. In particular, the light emitting device 100 that has been explained in Embodiment 1 can be produced with a small surface area, such as 15 mm×12 mm. In view of this, the size of the mouth ring 601 is preferably E17. In a case where the mouth ring 601 has a size of E26, the LED electric bulb 600 has a size of a maximum diameter of 60 mm and a maximum height of 110 mm, for example.

On the base plate 604 is formed a spot-faced area 610 (a depth of 1 mm). The light emitting device 100 is placed inside the spot-faced area 610 on the base plate 604, and fixed by tap pins 606. The first anode electrode 109, the second anode electrode 110, and the cathode electrode 111 of the light emitting device 100 are electrically connected to external wiring lines (a first anode connection wire 607, a second anode connection wire 608, and a cathode connection wire 609).

Further, in order to prevent light absorption, it is preferable that a surface (mounting surface) of the base plate 604, surfaces of nuts 605, surfaces of tap pins 606, the first anode connection wire 607, the second anode connection wire 608, and the cathode connection wire 609 be covered with white or milky white resin. Further, the base plate 604 may have a white or milky white satin-finished surface by pearskin finish.

Since the LED electric bulb 600 includes the light emitting device 100, it is possible to achieve a high color rendering property and an excellent color mixing property. Further, in the LED electric bulb 600 with the above arrangement, it is possible to easily adjust a chromaticity, thereby easily generating light at a desirable chromaticity. Thus, the LED electric bulb 600 is a very excellent illumination device. Further, since the LED electric bulb 600 employs the LED chips 102, it is possible to save energy and space, and the LED electric bulb 600 can be used for long periods.

Further, since the LED electric bulb 600 includes color-mixing means like the light-scattering-material-containing lens dome 603 (for example, a light-diffusing member, a light-diffusing sheet, an optical lens, or the like), it is possible to well mixing respective colors of pieces of light emitted from the light emitting device 100.

Embodiment 7

In the light emitting devices according to the aforementioned embodiments, each resin layers are formed in such a manner that (i) a liquid resin is filled into a corresponding area formed by partitioning, by the resin wall(s) 106, an area surrounded by the resin frame 105, and then (ii) the liquid resin is cured. However, in a case where the resin wall 106 is low, a resin injected into an area may be leaked into another area, thereby causing mixture of resins. In view of this, prevention of such a defect is desired.

Figure 22:
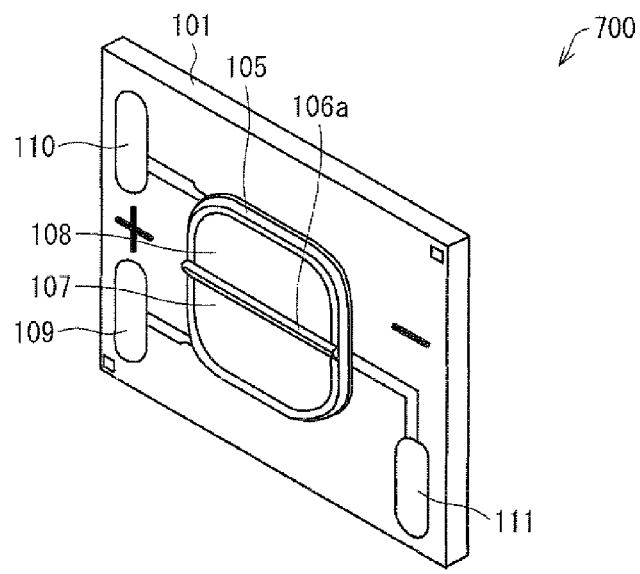
FIG. 22 is a perspective view illustrating a light emitting device in accordance with still another embodiment of the present invention.
Figure 23:
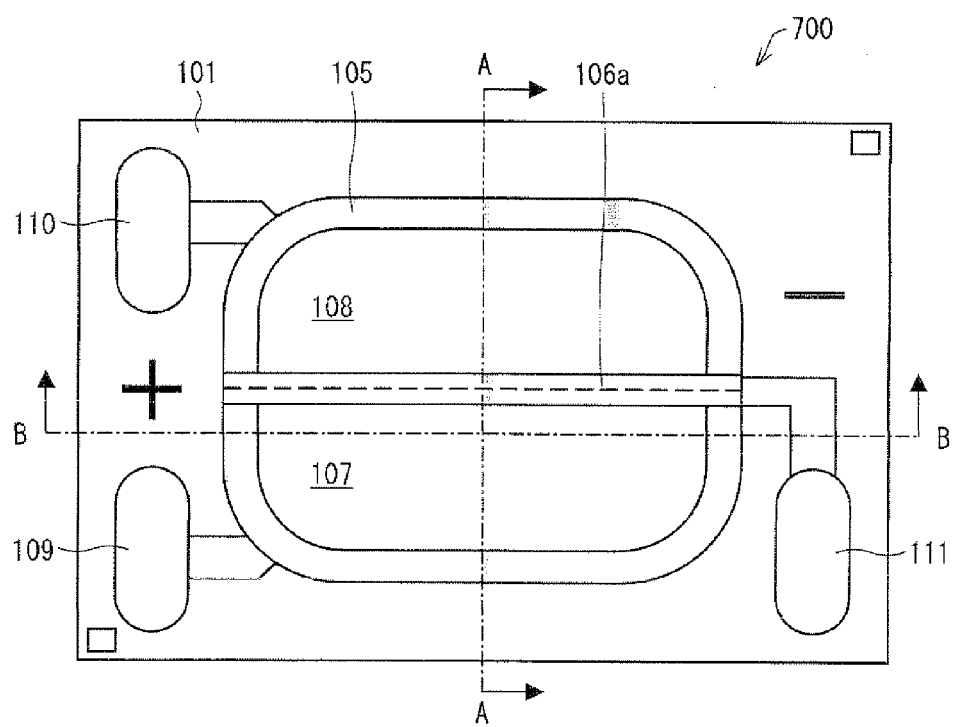
FIG. 23 is a top view illustrating the light emitting device illustrated in FIG. 22.
Figure 24:
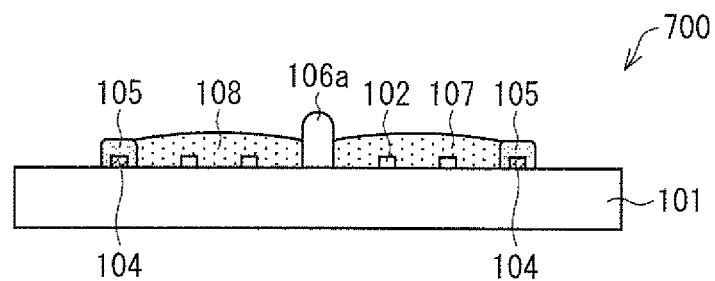
FIG. 24 is a cross-sectional view taken along a line A-A in FIG. 23.
Figure 25:
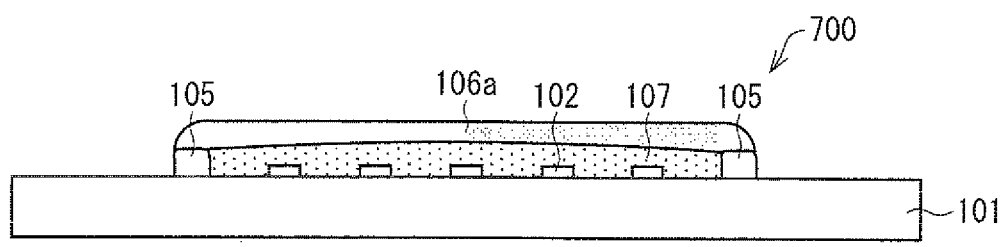
FIG. 25 is a cross-sectional view taken along a line B-B in FIG. 23.

The present embodiment deals with a light emitting device that can prevent an occurrence of such a defect. FIG. 22 is a perspective view illustrating one exemplary arrangement of a light emitting device 700 according to the present embodiment. FIG. 23 is a top view illustrating one exemplary arrangement of the light emitting device 700 according to the present embodiment. FIG. 24 is a cross-sectional view taken along a line A-A in FIG. 23. FIG. 25 is a cross-sectional view taken along a line B-B in FIG. 23.

As illustrated in FIG. 22 to FIG. 25, the light emitting device 700 according to the present embodiment includes a resin wall 106a, instead of the resin wall 106 provided in the light emitting device 100 according to Embodiment 1. That is, the light emitting device 700 includes a substrate 101, LED chips 102, printed resistors 104, a resin frame 105, a resin wall 106a, a first fluorescent-material-containing resin layer 107, and a second fluorescent-material-containing resin layer 108.

When FIG. 24 is compared with FIG. 2, it is apparent that the light emitting device 700 is different from the light emitting device 100 in the number and arrangement of the LED chips 102. As described above, the LED chips 102 can be arranged in various manners, and therefore, how the LED chips 102 are arranged is not explained here. Instead, the present embodiment gives an explanation mainly about the resin wall 106a.

The resin wall 106a is a boundary wall that partitions an area surrounded by the resin frame 105 into a plurality of areas (zones). The resin wall 106a partitions the area surrounded by the resin frame 105 into respective formation areas of the first fluorescent-material-containing resin layer 107 and the second fluorescent-material-containing resin layer 108. The resin wall 106a is singularly provided along the y direction in a linear manner, and serves as a boundary wall between the first fluorescent-material-containing resin layer 107 and the second fluorescent-material-containing resin layer 108. Further, the resin wall 106a functions as a dam (banking member) for preventing leakage and mixture of resins between the first fluorescent-material-containing resin layer 107 and the second fluorescent-material-containing resin layer 108. As apparent from FIG. 24, the resin wall 106a is formed higher than the resin frame 105.

The resin wall 106a may be made from the same material as the resin wall 106. Further, the resin wall 106a may be made from a material that is the same as or different from that of the resin frame 105, as long as the resin wall 106a is provided to have contact with the resin frame 105 and to function as a partition for preventing leakage of resins between the first fluorescent-material-containing resin layer 107 and the second fluorescent-material-containing resin layer 108.

Next will be explained about how to form the resin wall 106a.

After the LED chips 102 are provided, the resin frame 105 is formed on a mounting surface of the substrate 101, first. More specifically, a liquid-type white silicone resin (containing a light-diffusing filler $TiO_2$) is drawn at a predetermined position by use of a dispenser, for example. Then, the resin is cured under such a condition that a curing temperature is 150° C. and a curing time is 60 minutes. Thus, the resin frame 105 is formed. After that, the resin wall 106a is formed on the mounting surface of the substrate 101. More specifically, in the same manner as the resin frame 105, a liquid-type white silicone resin (containing a light-diffusing filler $TiO_2$) is drawn at a predetermined position by use of a dispenser, for example, and then cured under such a condition that a curing temperature is 150° C. and a curing time 60 minutes. Thus, the resin wall 106a is formed. The curing temperature and the curing time exemplified above are just examples, and they are not especially limited.

The resin frame 105 has, for example, a resin height of 0.4 mm, a resin width of 0.4 mm, a longer side of 10 mm, and a shorter side of 7.4 mm. The resin wall 106a has, for example, a resin height of 0.8 mm, a resin width of 0.4 mm, and a linear portion of 10 mm.

Each of the first fluorescent-material-containing resin layer 107 and the second fluorescent-material-containing resin layer 108 has (a) a resin height of 0.4 mm at its marginal region in vicinity to the resin frame 105 and the resin wall 106a and (b) a resin height of 0.7 mm around its center. One reason why such a difference in height occurs is as follows: in forming the first fluorescent-material-containing resin layer 107 and the second fluorescent-material-containing resin layer 108, liquid resins are injected into respective areas surrounded by the resin frame 105 and the resin wall 106 so that the liquid resins do not flow over the resin frame 105. When the liquid resins are cured by heating, center portions of the liquid resins expand. Another reason is surface tension. For these reasons, the vicinal region to the resin frame 105 and the resin wall 106a has a height of 0.4 mm, and the center portion is formed in a convex shape having a height of 0.7 mm. In view of this, in order to surely prevent mixture of resins of the first fluorescent-material-containing resin layer 107 and second fluorescent-material-containing resin layer 108, the resin wall 106a is formed to have a resin height of 0.8 mm. Accordingly, the resin wall 106a may be formed by applying a resin several times and curing the resin so that the resin wall 106a has a resin height of 0.8 mm. The resin heights of the resin frame 105 and the resin wall 106a illustrated in FIGS. 24 and 25 are just examples.

The resin heights of the resin frame 105 and the resin wall 106a are not limited to the values exemplified above. The resin wall 106a is preferably higher than the resin frame 105, especially preferably about two to three times higher than the resin frame 105. If the resin wall 106a is not at least twice as high as the resin frame 105, the mixture of resins occurs between the first fluorescent-material-containing resin layer 107 and the second fluorescent-material-containing resin layer 108. As described in the above example, each resin layer is arranged such that its center portion is up to about 1.75 times higher than its marginal region. On the other hand, if the resin wall 106a is at least three times higher than the resin frame 105, it is difficult to generate light of a well-mixed color. In view of this, when the resin frame 105 is 0.2 mm to 0.5 mm high, for example, it is preferable that the resin wall 106a be 0.4 mm to 1.0 mm high, 0.6 mm to 1.5 mm high, or the like. Here, the terms "twice (two times)" and "three times" do not exactly indicate "two times" and "three times", respectively, but indicate approximate ranges around "two times" and "three times" (i.e., about two times and about three times).

Further, the resin wall 106a and the resin frame 105 may be formed in different steps, as described above. Alternatively, in a case where the resin wall 106a is made from the same material as the resin frame 105, they can be formed in the same step.

Figure 26:
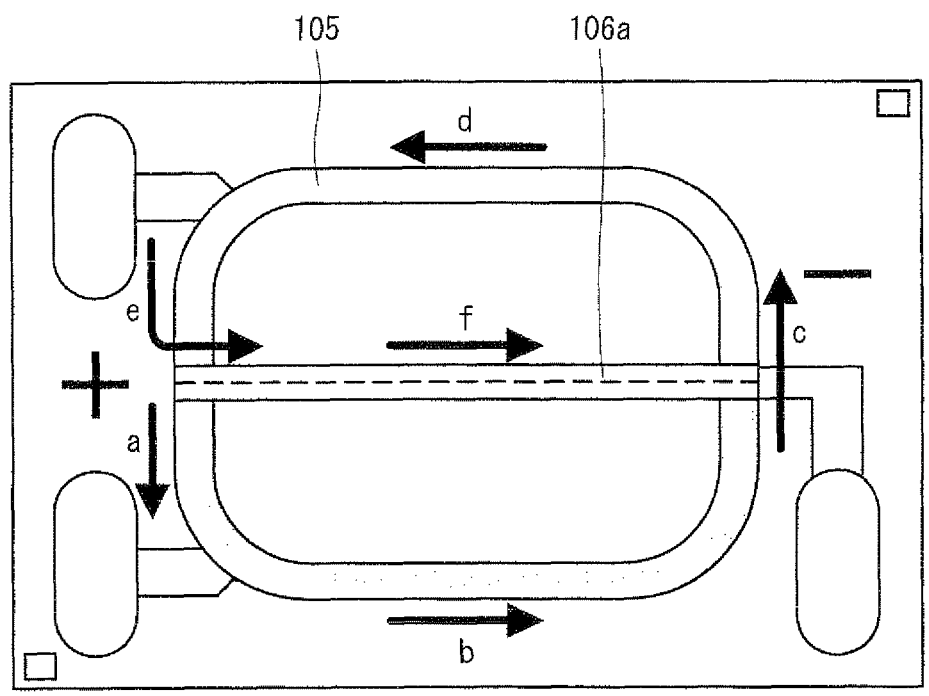
FIG. 26 is a view illustrating an example of how to form a resin frame and a resin wall in a same step in the light emitting device illustrated in FIG. 22.

FIG. 26 illustrates one example of how to form the resin frame 105 and the resin wall 106 in the same step in the light emitting device 700. In this case, as illustrated in FIG. 26, a liquid resin is drawn in the order of "a, b, c, d, e, and f". At portions indicated by the arrows e and f, the amount of the resin is adjusted so that the resin height becomes 0.8 mm. Thus, the resin frame 105 and the resin wall 106a can be formed in an integrated manner.

As described above, the light emitting device 700 is arranged such that the resin wall 106a is higher than the resin frame 105. With the arrangement, it is possible to prevent leakage and mixture of resins between the first fluorescent-material-containing resin layer 107 and the second fluorescent-material-containing resin layer 108 adjacent to each other via the resin wall 106a. Herewith, it is possible to achieve an excellent emission color and an excellent color mixing property.

The resin wall 106a is applicable to any one of the light emitting devices according to Embodiments 1 to 5. When the resin wall 106a is provided, it is possible to prevent leakage and mixture of resins between resin layers adjacent to each other via the resin wall 106a.

Example

The following describes how to adjust a chromaticity in each of the light emitting devices 100, 200, 300, 400, and 500 according to Embodiments 1, 2, 3, 4, and 5, respectively.

Figure 15:
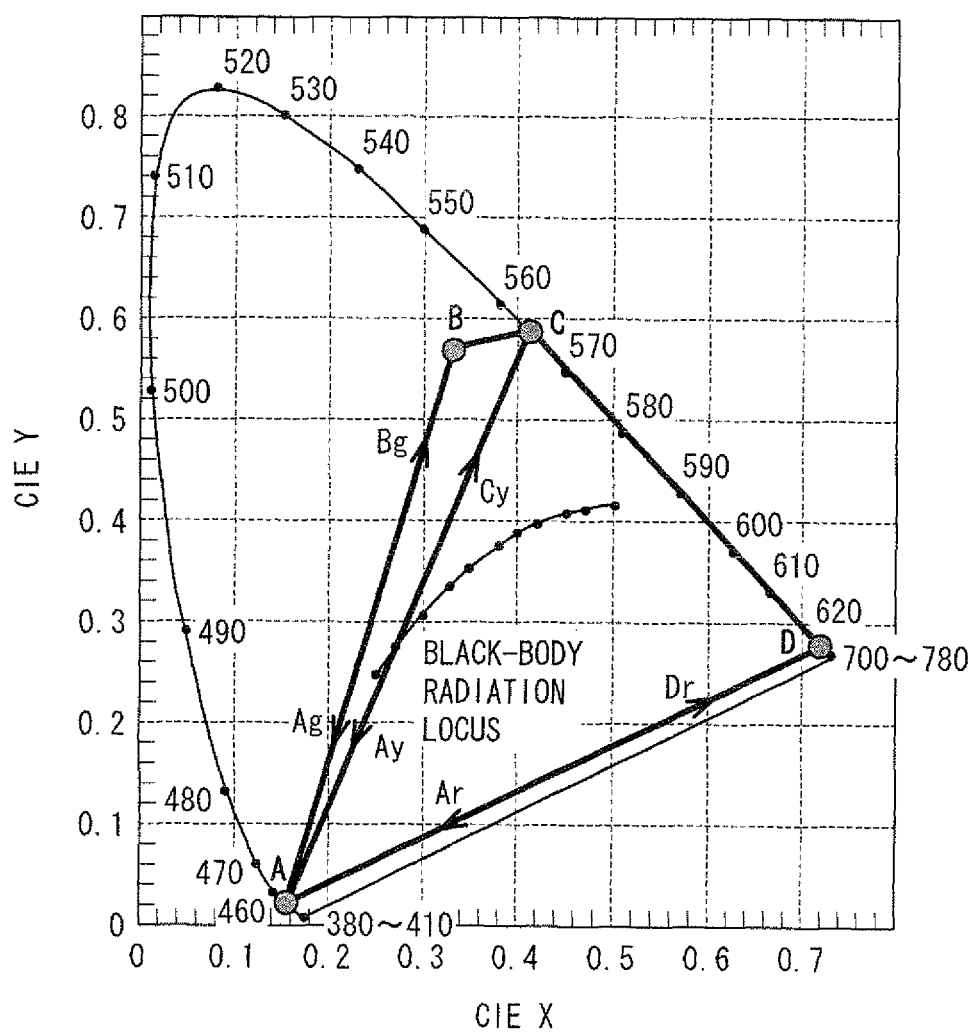
FIG. 15 is a graph showing CIE chromaticity coordinates (chromaticity diagram).

FIG. 15 is a graph of CIE chromaticity coordinates (chromaticity diagram). In the chromaticity diagram, a point A indicates a chromaticity of blue emission light (445 nm) from a blue LED chip; a point B indicates a chromaticity of light emitted from a green fluorescent material having a main wavelength of 515 nm; a point C indicates a chromaticity of light emitted from a yellow fluorescent material having a main wavelength of 564 nm; and a point D indicates a chromaticity of light emitted from a red fluorescent material and a red LED having a main wavelength of 650 nm.

Light from a light-emitting section (for example, an area where the first fluorescent-material-containing resin layer 107 is provided) that emits blue light and red light by "blue LEDs+red fluorescent material" has a chromaticity of light with mixed colors of the blue light and the red light. An intensity of the blue light can be changed appropriately by changing an amount of driving current supplied to the blue LEDs. However, an intensity of the red light is determined by the intensity (excitation intensity) of the blue light emitted from the blue LEDs (note that the red light has a saturation property). In view of this, the chromaticity of the light from this light-emitting section is indicated by a given point within a predetermined range (a segment connecting a point Ar and a point Dr) provided between both ends of a segment connecting the points A and D. That is, the chromaticity of this light-emitting section is adjustable to a given chromaticity within the predetermined range by controlling the driving current of the blue LEDs.

Note that the driving current has a lower limit and an upper limit, in consideration of (i) desirable emission luminance of an entire light emitting device and (ii) deterioration due to heat generation of the blue LEDs. Within what range the chromaticity is adjusted is determined depending on the range of the driving current.

Light from a light-emitting section (for example, an area where the second fluorescent-material-containing resin layer 108 is provided) that emits blue light and yellow light by "blue LEDs+yellow fluorescent material" has a chromaticity of light with mixed colors of the blue light and the yellow light. An intensity of the blue light can be changed appropriately by changing an amount of driving current supplied to the blue LEDs. However, an intensity of the yellow light is determined by the intensity (excitation intensity) of the blue light emitted from the blue LEDs (note that the yellow light has a saturation property). In view of this, the chromaticity of the light from this light-emitting section is indicated by a given point within a predetermined range (a segment connecting a point Ay and a point Cy) provided between both ends of a segment connecting the points A and C. That is, the chromaticity of this light-emitting section is adjustable to a given chromaticity within the predetermined range by controlling the driving current of the blue LEDs.

Light from a light-emitting section (for example, an area where the third fluorescent-material-containing resin layer 201 is provided) that emits blue light and green light by "blue LEDs+green fluorescent material" has a chromaticity of light with mixed colors of the blue light and the green light. An intensity of the blue light can be changed appropriately by changing an amount of driving current supplied to the blue LEDs. However, an intensity of the green light is determined by the intensity (excitation intensity) of the blue light emitted from the blue LEDs (note that the green light has a saturation property). In view of this, the chromaticity of the light from this light-emitting section is indicated by a given point within a predetermined range (a segment connecting a point Ag and a point Bg) provided between both ends of a segment connecting the points A and B. That is, the chromaticity of this light-emitting section is adjustable to a given chromaticity within the predetermined range by controlling the driving current of the blue LEDs.

Light from a light-emitting section (for example, an area where red LEDs are provided and the translucent resin layer 502 is provided) that emits red light by "red LEDs" has a chromaticity indicated by the point D on the chromaticity diagram. Thus, this light-emitting section can obtain the chromaticity of the point D.

(1) Embodiment 1

Light Emitting Device 100 (FIG. 1)

Light emitted from the light emitting device 100 has a chromaticity of a given point within a square connecting the points Ay, Cy, Dr, and Ar. That is, by adjusting an amount of the driving current, the light emitting device 100 can have a chromaticity of a given point within the square connecting the points Ay, Cy, Dr, and Ar. In other words, by adjusting the square, it is possible to generate white light in which color deviation is restrained at a desired color temperature.

(2) Embodiments 2 to 4

Light Emitting Devices 200, 300, 400 (FIG. 9, FIG. 11, FIG. 12)

Light emitted from the light emitting device 200 has a chromaticity of a given point within a polygon connecting the points Ag, Bg, Cy, Dr, Ar, and Ay. That is, by adjusting an amount of the driving current, the light emitting device 200 can have a chromaticity of a given point within the polygon connecting the points Ag, Bg, Cy, Dr, Ar, and Ay. In other words, by adjusting the polygon, it is possible to generate white light in which color deviation is restrained at a desired color temperature.

(3) Embodiment 5

Light Emitting Device 500 (FIG. 13)

Light emitted from the light emitting device 500 has a chromaticity of a given point within a polygon connecting the points Ag, Bg, Cy, D, and Ay. That is, by adjusting an amount of the driving current, the light emitting device 500 can have a chromaticity of a given point within the polygon connecting the points Ag, Bg, Cy, D, and Ay. In other words, by adjusting the polygon, it is possible to generate white light in which color deviation is restrained at a desired color temperature.

As such, in the light emitting devices 100, 200, 300, 400, and 500 respectively according to Embodiments 1, 2, 3, 4, and 5, it is possible to change a color in a desired direction in the chromaticity. This allows the light emitting devices 100, 200, 300, 400, and 500 to generate light at a desired chromaticity within an adjusted variable color gamut. That is, each of the light emitting devices 100, 200, 300, 400, and 500 can have a variable-color lineup within a range suitable for purpose.

Accordingly, it is possible to achieve a high color rendering property and an excellent color reproducibility and to easily adjust a chromaticity so that light can be easily generated at a desired chromaticity.

The light emitting devices 100, 200, 300, 400, and 500 respectively according to Embodiments 1, 2, 3, 4, and 5 include no light-emitting section that emits only blue light. However, in a similar manner to the light-emitting section constituted by (a) the LED chips 501 that emit red light and (b) the translucent resin layer 502, as described in connection with the light emitting device 500 according to Embodiment 5, the light emitting devices 100, 200, 300, 400, and 500 may include a light-emitting section in which LED chips 102 that emit blue light are sealed with a translucent resin containing no fluorescent material so that the light-emitting section emit only blue light. This allows the light emitting device to adjust blue light independently, thereby making it possible to expand an adjustable range of an entire chromaticity of the light emitting device in combination with other light-emitting sections that emit light of a color other than blue.

The present invention is not limited to the description of the embodiments above, but may be altered by a skilled person within the scope of the claims. An embodiment based on a proper combination of technical means disclosed in different embodiments is encompassed in the technical scope of the present invention.

A light emitting device according to the present invention is a light emitting device using light emitting elements, and includes: a substrate; a resin frame provided annularly on the substrate; a resin wall provided on the substrate so as to partition an area surrounded by the resin frame into n (2≤n) zones; light-emitting sections provided in the respective zones, each of which light-emitting sections includes at least one light emitting element; and anode electrodes and a cathode electrode provided so that each of the light-emitting sections receives current via a corresponding anode electrode and the cathode electrode, at least two of the light-emitting sections emitting respective pieces of light each having at least one color, which respective pieces of light having different colors from each other, the anode electrodes including k (2≤k≤n) anode electrodes provided outside the resin frame on the substrate in such a manner that each of the anode electrodes is electrically connected to at least one of the light-emitting sections such that the anode electrodes are electrically connected to different light-emitting sections.

Further, in the light emitting device according to the present invention, it is preferable that the resin frame and the resin wall have a light reflectivity or a light blocking effect. This makes it possible to prevent light absorption by the resin frame and the resin wall, and a decrease in luminous efficiency.

Further, in the light emitting device according to the present invention, it is preferable that at least one of the light-emitting sections emit at least blue light and yellow light, and at least another one of the light-emitting sections, which is different from the at least one of the light-emitting sections, emits at least red light.

Normally, white light generated by mixture of blue light and yellow light has a poor red-light emission component, and therefore the white light is pseudo white light that is wholly yellowish. In contrast, in the above arrangement, it is possible to adjust additive ratios of white light and red light. Therefore, white light in which color deviation is restrained can be easily obtained by increasing an additive ratio of the red-light emission component. Further, when an amount of red light is increased, it is possible to generate mixed light of warm color (like color of a bulb).

Further, the light emitting device according to the present invention is preferably arranged such that: the light-emitting sections include two light-emitting sections; a first light-emitting section of them emits blue light and red light; and a second light-emitting section of them emits blue light and yellow light. With the arrangement, it is possible to solely generate white light obtained by mixture of blue light and yellow light, and it is also possible to generate mixed light of white light, red light, and blue light.

Further, in order to easily attain the above light emission arrangement, the light emitting device according to the present invention is preferably arranged such that: the first light-emitting section includes (a) a blue-light emitting element that emits blue light, as the at least one light emitting element, and (b) a red-fluorescent-material-containing resin layer formed by filling resin containing a red fluorescent material into a corresponding zone so as to cover the blue light emitting element; and the second light-emitting section includes (a) a blue-light emitting element that emits blue light, as the at least one light emitting element, and (b) a yellow-fluorescent-material-containing resin layer formed by filling resin containing a yellow fluorescent material into a corresponding zone so as to cover the blue light emitting element.

Further, the light emitting device according to the present invention is preferably arranged such that: the light-emitting sections include three light-emitting sections; a first light-emitting section among them emits blue light and green light; a second light-emitting section among them emits blue light and yellow light; and a third light-emitting section among them emits blue light and red light.

With the above arrangement, it is possible to solely generate pseudo white light obtained by mixture of blue light and yellow light, and it is also possible to generate mixed light of white light, red light, green light, and blue light. Further, it is possible to adjust by what ratio pseudo white light, red light, and green light are mixed with each other. This accordingly makes it possible to increase additive ratios of emission components of red light and green light, thereby easily generating white light in which color deviation is restrained, and further obtaining a widely variable color gamut.

Moreover, in order to easily attain the above light emission arrangement, the light emitting device according to the present invention is preferably arranged such that the first light-emitting section includes (a) a blue-light emitting element that emits blue light, as the at least one light emitting element, and (b) a green-fluorescent-material-containing resin layer formed by filling resin containing a green fluorescent material into a corresponding zone so as to cover the blue light emitting element; the second light-emitting section includes (a) a blue-light emitting element that emits blue light, as the at least one light emitting element, and (b) a yellow-fluorescent-material-containing resin layer formed by filling resin containing a yellow fluorescent material into a corresponding zone so as to cover the blue light emitting element; and the third light-emitting section includes (a) a blue-light emitting element that emits blue light, as the at least one light emitting element, and (b) a red-fluorescent-material-containing resin layer formed by filling resin containing a red fluorescent material into a corresponding zone so as to cover the blue light emitting element.

In the light emitting device according to the present invention, it is preferable that the first light-emitting section, the second light-emitting section, and the third light-emitting section be provided in line.

Further, the light emitting device according to the present embodiment is preferably arranged such that the light-emitting sections include four light-emitting sections; a first light-emitting section among them emits blue light and red light; a second light-emitting section among them emits blue light and yellow light; a third light-emitting section among them emits blue light and green light; and a fourth light-emitting section among them emits blue light and red light.

With the above arrangement, it is possible to solely generate pseudo white light obtained by mixture of blue light and yellow light, to solely generate white light obtained by mixture of red light, green light, and blue light, and further to generate mixed light of pseudo white light, red light, green light, and blue light. Furthermore, with the above arrangement, it is possible to adjust by what ratio pseudo white light, red light, and green light are mixed with each other. This makes it possible to increase additive ratios of emission components of red light and green light, thereby easily generating white light in which color deviation is restrained, and further obtaining a widely variable color gamut.

In order to easily attain the above light emission arrangement, the light emitting device is preferably arranged such that: each of the first light-emitting section and the fourth light-emitting section includes (a) a blue-light emitting element that emits blue light, as the at least one light emitting element, and (b) a red-fluorescent-material-containing resin layer formed by filling resin containing a red fluorescent material into a corresponding zone so as to cover the blue light emitting element; the second light-emitting section includes (a) a blue-light emitting element that emits blue light, as the at one light emitting element, and (b) a yellow-fluorescent-material-containing resin layer formed by filling resin containing a yellow fluorescent material into a corresponding zone so as to cover the blue light emitting element; and the third light-emitting section includes (a) a blue-light emitting element that emits blue light, as the at least one light emitting element, and (b) a green-fluorescent-material-containing resin layer formed by filling resin containing a green fluorescent material into a corresponding zone so as to cover the blue light emitting element.

Further, the light emitting device according to the present invention is preferably arranged such that the anode electrodes include three anode electrodes; one of the three anode electrodes is electrically connected to the first light-emitting section and the fourth light-emitting section; and the other two of the three anode electrodes are electrically connected to the second light-emitting section and the third light-emitting section, respectively.

The above arrangement contributes to downsizing of the light emitting device. Further, with the above arrangement, by adjusting lighting conditions (light-emission intensities) of the light-emitting sections from the respective anode electrodes, it is possible to easily generate white light with a high color rendering property or an excellent color reproducibility.

Further, in the light emitting device according to the present invention, it is preferable that: the three anode electrodes each have an elliptical shape when viewed in a plane manner; and the three anode electrodes be provided in line such that a longitudinal direction of a center one of the three anode electrodes is perpendicular to longitudinal directions of the other two of the three anode electrodes that sandwich the center one. This arrangement makes it possible to easily perform wire connection (for example, soldering) between the anode electrodes and external wiring lines.

Further, the light emitting device according to the present invention is preferably arranged such that the anode electrodes include two anode electrodes; one of the two anode electrodes is electrically connected to the first light-emitting section and the third light-emitting section; and the other one of the two anode electrodes is electrically connected to the second light-emitting section and the fourth light-emitting section.

The above arrangement contributes to downsizing of the light emitting device. Further, with the above arrangement, by adjusting lighting conditions (light-emission intensities) of the light-emitting sections from the respective anode electrodes, it is possible to easily generate white light with a high color rendering property or an excellent color reproducibility.

Moreover, the light emitting device according to the present invention is preferably arranged such that the light-emitting sections include four light-emitting sections; a first light-emitting section among them emits red light; a second light-emitting section among them emits blue light and yellow light; a third light-emitting section among them emits blue light and green light; and a fourth light-emitting section among them emits red light.

With the above arrangement, it is possible to solely generate pseudo white light obtained by mixture of blue light and yellow light, to solely generate white light obtained by mixture of red light, green light, and blue light, and further to generate mixed light of pseudo white light, red light, green light, and blue light. Furthermore, with the above arrangement, it is possible to adjust by what ratio pseudo white light, red light, and green light are mixed with each other. This makes it possible to increase additive ratios of emission components of red light and green light, thereby easily generating white light in which color deviation is restrained, and further obtaining a widely variable color gamut.

Furthermore, in order to easily attain the above light emission arrangement, the light emitting device according to the present invention is preferably arranged such that each of the first light-emitting section and the fourth light-emitting section includes (a) a red-light emitting element that emits red light, as the at least one light emitting element, and (b) a translucent resin layer formed by filling translucent resin into a corresponding zone so as to cover the red light emitting element; the second light-emitting section includes (a) a blue-light emitting element that emits blue light, as the at least one light emitting element, and (b) a yellow-fluorescent-material-containing resin layer formed by filling resin containing a yellow fluorescent material into a corresponding zone so as to cover the blue light emitting element; and the third light-emitting section includes (a) a blue-light emitting element that emits blue light, as the at least one light emitting element, and (b) a green-fluorescent-material-containing resin layer formed by filling resin containing a green fluorescent material into a corresponding zone so as to cover the blue light emitting element.

Further, the light emitting device according to the present invention is preferably arranged such that the anode electrodes include three anode electrodes; one of the three anode electrodes is electrically connected to the first light-emitting section and the fourth light-emitting section; and the other two of the three anode electrodes are electrically connected to the second light-emitting section and the third light-emitting section, respectively.

The above arrangement contributes to downsizing of the light emitting device. Further, with the above arrangement, by adjusting lighting conditions (light-emission intensities) of the light-emitting sections from the respective anode electrodes, it is possible to easily generate white light with a high color rendering property or an excellent color reproducibility.

Further, the light emitting device according to the present invention is preferably arranged such that the resin wall is provided in a crisscross shape when viewed in a plane manner; and a zone in which the first light-emitting section is provided is not adjacent to a zone in which the fourth light-emitting section is provided. The arrangement can improve a color mixing property of overall light emitted from the light emitting device when the four light-emitting sections are turned on at the same time.

Further, in the light emitting device according to the present invention, it is preferable that the substrate be a ceramic substrate made from ceramics.

Further, in the light emitting device according to the present invention, is preferable that the resin frame have an annularly-circular shape when viewed in a plane manner. In this arrangement, when four light-emitting sections are turned on at the same time, a whole light-emission region of the light emitting device becomes a round shape, so that light is readily emitted toward all directions in a uniform manner. This allows the light emitting device to be easily used in general-purpose lighting apparatuses and such general-purpose lighting apparatus to be easily designed.

Further, the light emitting device according to the present invention is preferably arranged such that the light-emitting sections each include a plurality of light emitting elements; and each of the plurality of light emitting elements has a rectangular shape or a square shape when viewed in a plane manner. This can increase flexibility in how to arrange the light emitting elements and the number of light emitting elements to be provided.

Furthermore, it is preferable that the light emitting device according to the present invention further include a protective element, which is connected in parallel with the at least one light emitting element provided in each of the light-emitting sections. In the arrangement, the protective element is connected in parallel with the light emitting elements, thereby making it possible to prevent deterioration of the light emitting element. As a result, the light emitting device can be used for long periods, which ensures reliability of the light emitting device.

Further, in the light emitting device according to the present invention, it is preferable that the resin wall be higher than the resin frame. This can prevent leakage and mixture of resins between light-emitting sections adjacent to each other via the resin wall in a case where the light-emitting sections are each constituted by light emitting elements and a resin layer covering the light emitting elements. As a result, it is possible to obtain an excellent emission color and an excellent color mixing property.

Moreover, in the light emitting device according to the present invention, it is preferable that the resin wall have contact with the resin frame.

INDUSTRIAL APPLICABILITY

The present invention can be preferably used not only in a field related to a light emitting device using an LED, but also in a field related to how to produce a light emitting device. Moreover, the present invention can be widely used in a field of an electronic device (illumination device) including a light emitting device.

REFERENCE SIGNS LIST 100, 150, 200, 300, 400, 500, 700 Light Emitting Device
101, 901 Substrate
102, 151 LED Chip (Light Emitting Element, Blue-light Emitting Element)
104 Printed Resistor (Protective Element)
105 Resin Frame
106, 106a Resin Wall
107 First Fluorescent-material-containing Resin Layer (First Light-emitting Section, Red-fluorescent-material-containing Resin Layer)
108 Second Fluorescent-material-containing Resin Layer (Second Light-emitting Section, Yellow-fluorescent-material-containing Resin Layer)
109 First Anode Electrode (Anode Electrode)
110 Second Anode Electrode (Anode Electrode)
111 Cathode Electrode
201 Third Fluorescent-material-containing Resin Layer (First Light-emitting Section, Green-fluorescent-material-containing Resin Layer)
202 Fourth Fluorescent-material-containing Resin Layer (Second Light-emitting Section, Yellow-fluorescent-material-containing Resin Layer)
203 Fifth Fluorescent-material-containing Resin Layer (Third Light-emitting Section, Red-fluorescent-material-containing Resin Layer)
204 Third Anode Electrode (Anode Electrode)
301 Sixth Fluorescent-material-containing Resin Layer (First Light-emitting Section, Red-fluorescent-material-containing Resin Layer)
302 Seventh Fluorescent-material-containing Resin Layer (Second Light-emitting Section, Yellow-fluorescent-material-containing Resin Layer)
303 Eighth Fluorescent-material-containing Resin Layer (Third Light-emitting Section, Green-fluorescent-material-containing Resin Layer)
304 Ninth Fluorescent-material-containing Resin Layer (Fourth Light-emitting Section, Red-fluorescent-material-containing Resin Layer)
501 LED Chip (Light Emitting Element, Red-light Emitting Element)
502 Translucent Resin Layer (First Light-emitting Section, Fourth Light-emitting Section)
600 LED Electric Bulb (Illumination Device)
603 Light-scattering-material-containing Lens Dome

The invention claimed is:

1. A light emitting device using light emitting elements, comprising:
   a substrate;
   a resin frame provided annularly on the substrate;
   a resin wall provided on the substrate so as to partition an area surrounded by the resin frame into n ($2 \leq n$) zones;
   light-emitting sections provided in the respective zones, each of which light-emitting sections includes at least one light emitting element; and
   anode electrodes and a cathode electrode provided so that each of the light-emitting sections can receive current via a corresponding anode electrode and the cathode electrode,
   at least two of the light-emitting sections for emitting respective emissions of light each having at least one color, which respective emissions of light have different colors from each other,
   the anode electrodes including k ($2 \leq k \leq n$) anode electrodes provided outside the resin frame on the substrate in such a manner that each of the anode electrodes is electrically connected to at least one of the light-emitting sections such that the anode electrodes are electrically connected to different light-emitting sections,
   wherein at least one of the light-emitting sections is for emitting at least blue light and yellow light, and at least another one of the light-emitting sections, which is different from the at least one of the light-emitting sections, is for emitting at least red light.

2. The light emitting device as set forth in claim 1, wherein: the light-emitting sections include two light-emitting sections; a first light-emitting section of them is for emitting blue light and red light; and a second light-emitting section of them is for emitting blue light and yellow light.

3. The light emitting device as set forth in claim 2, wherein: the first light-emitting section includes (a) a blue-light emitting element that is for emitting blue light, as the at least one light emitting element, and (b) a red-fluorescent-material-containing resin layer formed by filling resin containing a red fluorescent material into a corresponding zone so as to cover the blue light emitting element; and the second light-emitting section includes (a) a blue-light emitting element that is for emitting blue light, as the at least one light emitting element, and (b) a yellow-fluorescent-material-containing resin layer formed by filling resin containing a yellow fluorescent material into a corresponding zone so as to cover the blue light emitting element.

4. The light emitting device as set forth in claim 1, wherein: the light-emitting sections include three light-emitting sections; a first light-emitting section among them emits blue light and green light; a second light-emitting section among them emits blue light and yellow light; and a third light-emitting section among them emits blue light and red light.

5. The light emitting device as set forth in claim 4, wherein: the first light-emitting section includes (a) a blue-light emitting element that emits blue light, as the at least one light emitting element, and (b) a green-fluorescent-material-containing resin layer formed by filling resin containing a green fluorescent material into a corresponding zone so as to cover the blue light emitting element; the second light-emitting section includes (a) a blue-light emitting element that emits blue light, as the at least one light emitting element, and (b) a yellow-fluorescent-material-containing resin layer formed by filling resin containing a yellow fluorescent material into a corresponding zone so as to cover the blue light emitting element; and the third light-emitting section includes (a) a blue-light emitting element that emits blue light, as the at least one light emitting element, and (b) a red-fluorescent-material-containing resin layer formed by filling resin containing a red fluorescent material into a corresponding zone so as to cover the blue light emitting element.

6. The light emitting device as set forth in claim 4, wherein: the first light-emitting section, the second light-emitting section, and the third light-emitting section are provided in line.

7. The light emitting device as set forth in claim 1, wherein: the light-emitting sections include four light-emitting sections; a first light-emitting section among them emits blue light and red light; a second light-emitting section among them emits blue light and yellow light; a third light-emitting section among them emits blue light and green light; and a fourth light-emitting section among them emits blue light and red light.

8. The light emitting device as set forth in claim 7, wherein: each of the first light-emitting section and the fourth light-emitting section includes (a) a blue-light emitting element that emits blue light, as the at least one light emitting element, and (b) a red-fluorescent-material-containing resin layer formed by filling resin containing a red fluorescent material into a corresponding zone so as to cover the blue light emitting element; the second light-emitting section includes (a) a blue-light emitting element that emits blue light, as the at least one light emitting element, and (b) a yellow-fluorescent-material-containing resin layer formed by filling resin containing a yellow fluorescent material into a corresponding zone so as to cover the blue light emitting element; and the third light-emitting section includes (a) a blue-light emitting element that emits blue light, as the at least one light emitting element, and (b) a green-fluorescent-material-containing resin layer formed by filling resin containing a green fluorescent material into a corresponding zone so as to cover the blue light emitting element.

9. The light emitting device as set forth in claim 7, wherein: the anode electrodes include three anode electrodes; one of the three anode electrodes is electrically connected to the first light-emitting section and the fourth light-emitting section; and the other two of the three anode electrodes are electrically connected to the second light-emitting section and the third light-emitting section, respectively.

10. The light emitting device as set forth in claim 9, wherein: the three anode electrodes each have an elliptical shape when viewed in a plane manner; and the three anode electrodes are provided in line such that a longitudinal direction of a center one of the three anode electrodes is perpendicular to longitudinal directions of the other two of the three anode electrodes that sandwich the center one.

11. The light emitting device as set forth in claim 7, wherein: the anode electrodes include two anode electrodes; one of the two anode electrodes is electrically connected to the first light-emitting section and the third light-emitting section; and the other one of the two anode electrodes is electrically connected to the second light-emitting section and the fourth light-emitting section.

12. The light emitting device as set forth in claim 7, wherein: the resin wall is provided in a crisscross shape when viewed in a plane manner, a zone in which the first light-emitting section is provided is not adjacent to a zone in which the fourth light-emitting section is provided.

13. The light emitting device as set forth in claim 1, wherein: the light-emitting sections include four light-emitting sections; a first light-emitting section among them emits red light; a second light-emitting section among them emits blue light and yellow light; a third light-emitting section among them emits blue light and green light; and a fourth light-emitting section among them emits red light.

14. The light emitting device as set forth in claim 13, wherein: each of the first light-emitting section and the fourth light-emitting section includes (a) a red-light emitting element that emits red light, as the at least one light emitting element, and (b) a translucent resin layer formed by filling translucent resin into a corresponding zone so as to cover the red light emitting element; the second light-emitting section includes (a) a blue-light emitting element that emits blue light, as the at least one light emitting element, and (b) a yellow-fluorescent-material-containing resin layer formed by filling resin containing a yellow fluorescent material into a corresponding zone so as to cover the blue light emitting element; and the third light-emitting section includes (a) a blue-light emitting element that emits blue light, as the at least one light emitting element, and (b) a green-fluorescent-material-containing resin layer formed by filling resin containing a green fluorescent material into a corresponding zone so as to cover the blue light emitting element.

15. The light emitting device as set forth in claim 13, wherein: the anode electrodes include three anode electrodes; one of the three anode electrodes is electrically connected to the first light-emitting section and the fourth light-emitting section; and the other two of the three anode electrodes are electrically connected to the second light-emitting section and the third light-emitting section, respectively.

16. The light emitting device as set forth in claim 13, wherein: the resin wall is provided in a crisscross shape when viewed in a plane manner; and a zone in which the first light-emitting section is provided is not adjacent to a zone in which the fourth light-emitting section is provided.

17. The light emitting device as set forth in claim 1, wherein the substrate is a ceramic substrate made from ceramics.

18. The light emitting device as set forth in claim 1, wherein the resin frame has an annularly-circular shape when viewed in a plane manner.

19. The light emitting device as set forth in claim 1, wherein: the light-emitting sections each include a plurality of light emitting elements; and each of the plurality of light emitting elements has a rectangular shape or a square shape when viewed in a plane manner.

20. The light emitting device as set forth in claim 1, further comprising a protective element, which is connected in parallel with the at least one light emitting element provided in each of the light-emitting sections.

21. The light emitting device as set forth in claim 1, wherein the resin wall is higher than the resin frame.

22. The light emitting device as set forth in claim 1, wherein the resin wall has contact with the resin frame.

23. A light emitting device using light emitting elements, comprising:
- a substrate;
- a resin frame provided annularly on the substrate;
- a resin wall provided on the substrate so as to partition an area surrounded by the resin frame into n ($2 \leq n$) zones;
- light-emitting sections provided in the respective zones, each of which light-emitting sections includes at least one light emitting element; and
- anode electrodes and a cathode electrode provided so that each of the light-emitting sections can receive current via a corresponding anode electrode and the cathode electrode,
- at least two of the light-emitting sections for emitting respective emissions of light each having at least one color, which respective emissions of light have different colors from each other,
- the anode electrodes including k ($2 \leq k \leq n$) anode electrodes provided outside the resin frame on the substrate in such a manner that each of the anode electrodes is electrically connected to at least one of the light-emitting sections such that the anode electrodes are electrically connected to different light-emitting sections,
- wherein at least one of the light-emitting sections is for emitting at least blue light and green light, and at least another one of the light-emitting sections, which is different from the at least one of the light-emitting sections, is for emitting at least red light.

* * * * *